(12) United States Patent
Crouch et al.

(10) Patent No.: US 12,393,327 B2
(45) Date of Patent: Aug. 19, 2025

(54) SYSTEMS AND METHODS FOR CONFIGURING A FIRE ALARM CONTROL PANEL

(71) Applicant: Johnson Controls Tyco IP Holdings LLP, Milwaukee, WI (US)

(72) Inventors: Jason S. Crouch, Delray Beach, FL (US); Robin M. C. Perkins, Phillipston, MA (US); Jason M. Spiva, Jenks, OK (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 140 days.

(21) Appl. No.: 17/388,514

(22) Filed: Jul. 29, 2021

(65) Prior Publication Data

US 2023/0036108 A1 Feb. 2, 2023

(51) Int. Cl.
| | |
|---|---|
| G06F 3/048 | (2013.01) |
| G01R 31/367 | (2019.01) |
| G06F 3/04815 | (2022.01) |
| G06F 3/0482 | (2013.01) |
| G06F 3/04847 | (2022.01) |
| G06F 30/12 | (2020.01) |
| G06Q 10/0875 | (2023.01) |
| G08B 25/14 | (2006.01) |
| G06Q 50/26 | (2012.01) |
| G08B 25/00 | (2006.01) |

(52) U.S. Cl.
CPC ....... *G06F 3/04847* (2013.01); *G01R 31/367* (2019.01); *G06F 3/04815* (2013.01); *G06F 3/0482* (2013.01); *G06F 30/12* (2020.01); *G06Q 10/0875* (2013.01); *G08B 25/14* (2013.01); *G06Q 50/26* (2013.01); *G08B 25/00* (2013.01)

(58) Field of Classification Search
CPC ............ G06F 3/04847; G06F 3/04815; G06F 3/0482; G06F 30/12; G01R 31/367; G06Q 10/0875; G06Q 50/26; G08B 25/14; G08B 25/00
See application file for complete search history.

(56) References Cited

U.S. PATENT DOCUMENTS 7,068,164 B1 * 6/2006 Duncan ..................... G07C 9/27
340/506
7,380,210 B2 * 5/2008 Lontka ..................... G08B 25/14
709/224

(Continued)

*Primary Examiner* — Patrick F Riegler
(74) *Attorney, Agent, or Firm* — Foley & Lardner LLP

(57) ABSTRACT

A system for configuring a fire alarm control panel (FACP) is configured to receive a first user input identifying a configuration requirement of the FACP, obtain configuration data for a plurality of FACP components capable of being included in the FACP, the configuration data indicating at least one of a size, a power consumption, or a cost for at least one component of the plurality of FACP components, use the configuration data to generate a plurality of test sets defining a subset of the plurality of FACP components and indicating a unique layout of the FACP that satisfy the configuration requirement according to one or more configuration rules, identify a test set of the plurality of test sets based on configuration scores associated with each of the plurality of test sets, and present a visual representation of the unique layout of the FACP associated with the identified test set.

20 Claims, 17 Drawing Sheets

(56) References Cited

U.S. PATENT DOCUMENTS

| | | | |
|---|---|---|---|
| 11,209,798 B1* | 12/2021 | Michalowski | G05B 19/4188 |
| 2003/0048304 A1* | 3/2003 | Lontka | G08B 25/14 |
| | | | 715/771 |
| 2003/0050713 A1* | 3/2003 | Piersanti | G05B 15/02 |
| | | | 700/1 |
| 2004/0080408 A1* | 4/2004 | Reghetti | G06F 30/00 |
| | | | 340/515 |
| 2004/0080409 A1* | 4/2004 | Reghetti | G08B 29/18 |
| | | | 340/515 |
| 2005/0154566 A1* | 7/2005 | Farrell | G06F 30/13 |
| | | | 703/1 |
| 2008/0255818 A1* | 10/2008 | Jefferson | G06F 30/00 |
| | | | 703/13 |
| 2012/0133481 A1* | 5/2012 | Dedek | G08B 25/14 |
| | | | 340/5.2 |
| 2015/0348399 A1* | 12/2015 | Cree | G06F 3/0488 |
| | | | 715/740 |
| 2018/0005513 A1* | 1/2018 | Venkatesh | G08B 25/14 |
| 2019/0196424 A1* | 6/2019 | Meganathan | G06F 16/29 |
| 2019/0362618 A1* | 11/2019 | Rao | G08B 25/003 |
| 2020/0019287 A1* | 1/2020 | Sahai | G06F 3/0484 |
| 2021/0020021 A1* | 1/2021 | Sahai | A62C 37/04 |
| 2021/0110099 A1* | 4/2021 | Turan | H04L 63/12 |
| 2022/0036709 A1* | 2/2022 | Meruva | G08B 25/007 |
| 2023/0036108 A1* | 2/2023 | Crouch | G06F 3/04815 |

* cited by examiner

SYSTEMS AND METHODS FOR CONFIGURING A FIRE ALARM CONTROL PANEL

BACKGROUND

The present disclosure relates generally to fire alarm systems for buildings and more specifically to fire alarm control panels.

Fire alarm systems have become increasingly complex over time due to, for example, increased capabilities (e.g., network connectivity, integration with building management systems, etc.), the addition of newer components (e.g., detectors, sensors, alarms, etc.), increased system size, etc. Thus, it has become increasingly difficult to determine optimized layouts for the components that make up a fire alarm control panel. For example, there are limitations in size, placement, energy requirements, etc., that must be considered when designing a panel's layout. Additionally, inefficient fire alarm control panel layouts may unnecessarily increase the cost and complexity of the control panel and/or fire alarm system. It would be beneficial to have a system and/or method for quickly and easily determining an optimized fire alarm control panel layout that maximizes the use of space within a fire alarm control panel while meeting design requirements relating to cost, power, etc.

SUMMARY

One implementation of the present disclosure is a system for configuring a fire alarm control panel (FACP) including one or more memory devices having instructions stored thereon that, when executed by one or more processors, cause the one or more processors to perform operations including receiving a first user input identifying a configuration requirement of the FACP, obtaining configuration data for a plurality of FACP components capable of being included in the FACP, the configuration data indicating at least one of a size, a power consumption, or a cost for at least one component of the plurality of FACP components, using the configuration data to generate a plurality of test sets that satisfy the configuration requirement according to one or more configuration rules, each of the plurality of test sets defining a subset of the plurality of FACP components and indicating a unique layout of the FACP, identifying a test set of the plurality of test sets based on configuration scores associated with each of the plurality of test sets, and presenting, via a graphical user interface, a visual representation of the unique layout of the FACP associated with the identified test set.

In some embodiments, the operations further include receiving a second user input defining a number of bays for the FACP and the plurality of test sets are further generated based on the second user input.

In some embodiments, the operations further include receiving a second user input defining at least one of a standby or an alarm time power requirement and the plurality of test sets are further generated based on the second user input.

In some embodiments, the operations further include determining at least one of a number or a capacity of batteries to include in the FACP based on the unique layout associated with the identified test set.

In some embodiments, the visual representation includes a 3-dimensional (3D) model of the FACP populated with the at least one component.

In some embodiments, the one or more configuration rules define at least one of component placement within the FACP or power requirements for the FACP.

In some embodiments, the configuration scores include estimated costs associated with each of the plurality of test sets.

In some embodiments, the operations further include generating a bill of materials based on the unique layout of the FACP associated with the identified test set.

Another implementation of the present disclosure is a method for determining a layout of a fire alarm control panel (FACP) including receiving a first user input identifying a configuration requirement for the FACP, obtaining configuration data for a plurality of FACP components capable of being included in the FACP, the configuration data indicating at least one of a size, a power consumption, or a cost for at least one component of the plurality of FACP components, using the configuration data to generate a plurality of test sets that satisfy the configuration requirement according to one or more configuration rules, each of the plurality of test sets defining a subset of the plurality of FACP components and indicating a unique layout of the FACP, identifying a test set of the plurality of test sets based on configuration scores associated with each of the plurality of test sets, and presenting, via a graphical user interface, a visual representation of the unique layout of the FACP associated with the identified test set.

In some embodiments, the method further includes receiving a second user input defining a number of bays for the FACP and the plurality of test sets are further generated based on the second user input.

In some embodiments, the method further includes receiving a second user input defining at least one of a standby or an alarm time power requirement and the plurality of test sets are further generated based on the second user input.

In some embodiments, the method further includes determining at least one of a number or a capacity of batteries to include in the FACP based on the unique layout associated with the identified test set.

In some embodiments, the visual representation includes a 3-dimensional (3D) model of the FACP populated with the at least one component.

In some embodiments, the one or more configuration rules define at least one of component placement within the FACP or power requirements for the FACP.

In some embodiments, the configuration scores include estimated costs associated with each of the plurality of test sets.

In some embodiments, the method further includes generating a bill of materials based on the unique layout of the FACP associated with the identified test set.

Yet another implementation of the present disclosure is a non-transitory computer readable medium including instructions stored thereon that, when executed by one or more processors, cause the one or more processors to receive a first user input identifying a configuration requirement of a fire alarm control panel (FACP), obtain configuration data for a plurality of FACP components capable of being included in the FACP, the configuration data indicating at least one of a size, a power consumption, or a cost for at least one component of the plurality of FACP components, use the configuration data to generate a plurality of test sets that satisfy the configuration requirement according to one or more configuration rules, each of the plurality of test sets defining a subset of the plurality of FACP components and indicating a unique layout of the FACP, identify a test set of the plurality of test sets based on configuration scores associated with each of the plurality of test sets, and present, via a graphical user interface, a visual representation of the unique layout of the FACP associated with the identified test set.

In some embodiments, the instructions further cause the one or more processors to receive a second user input defining at least one of a standby or an alarm time power requirement and the plurality of test sets are further generated based on the second user input.

In some embodiments, the instructions further cause the one or more processors to determine at least one of a number or a capacity of batteries to include in the FACP based on the unique layout associated with the identified test set.

In some embodiments, the one or more configuration rules define at least one of component placement within the FACP or power requirements for the FACP.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 5 is an example interface of a fire alarm control panel configurator, according to some embodiments.

FIG. 6 is an example interface for viewing the components of a fire alarm control panel, according to some embodiments.

FIGS. 8A-8C illustrate various menus of the example interfaces of FIGS. 5-7 in greater detail, according to some embodiments.

DETAILED DESCRIPTION

Overview

Referring generally to the FIGURES, systems and methods for configuring and optimizing the layout of a fire alarm control panel (FACP) are shown, accordingly to various embodiments. An FACP, also referred to as a fire alarm control unit (FACU) or fire alarm panel, is a component of a fire alarm system configured to monitor and control various other components of the fire alarm system. An FACP may receive data from fire detection devices (e.g., smoke alarms, heat detectors, etc.) to detect and/or locate a fire, and may transmit commands to fire suppression devices (e.g., a sprinkler system) or alarm devices (e.g., sirens, lights, speakers, etc.). FACPs can also monitor the status of connected devices and can communicate data with other systems. For example, an FACP can determine a status (e.g., online, offline, warning, etc.) of a detection device and can also communicate information, such as the location of a detected fire, with remote system (e.g., a reporting system accessible by a fire department). In some cases, FACPs can provide electrical energy to fire alarm system components. For example, an FACP may contain one or more batteries for maintaining fire alarm system operations in the event of the loss of power from an energy provider (e.g., utility service).

As mentioned above, it can be difficult to optimize the layout and components that populate an FACP for different fire alarm systems. An FACP can be constructed from hundreds or thousands of different components with unique shapes and sizes, positioning requirements, power requirements, etc. Inefficient layouts can increase the cost associated with an FACP, and can lead to difficult installation, increased maintenance, and other issues (e.g., inadequate power supply). As described herein, an FACP configurator can determine FACP layouts optimized to cost or other design parameters. For example, an FACP can configured that minimizes construction and installation costs while including a plurality of components selected by a user and meeting power requirements for the plurality of components and/or other components of an alarm system (e.g., stand-by power). The FACP configurator can output 2D and/or 3D representations of optimized panel layouts, along with reports indicating a bill-of-materials, estimated cost, etc. Additional advantages and features of the FACP configurator are described in greater detail below.

Fire Alarm Control Panel Configuration

Figure 1:
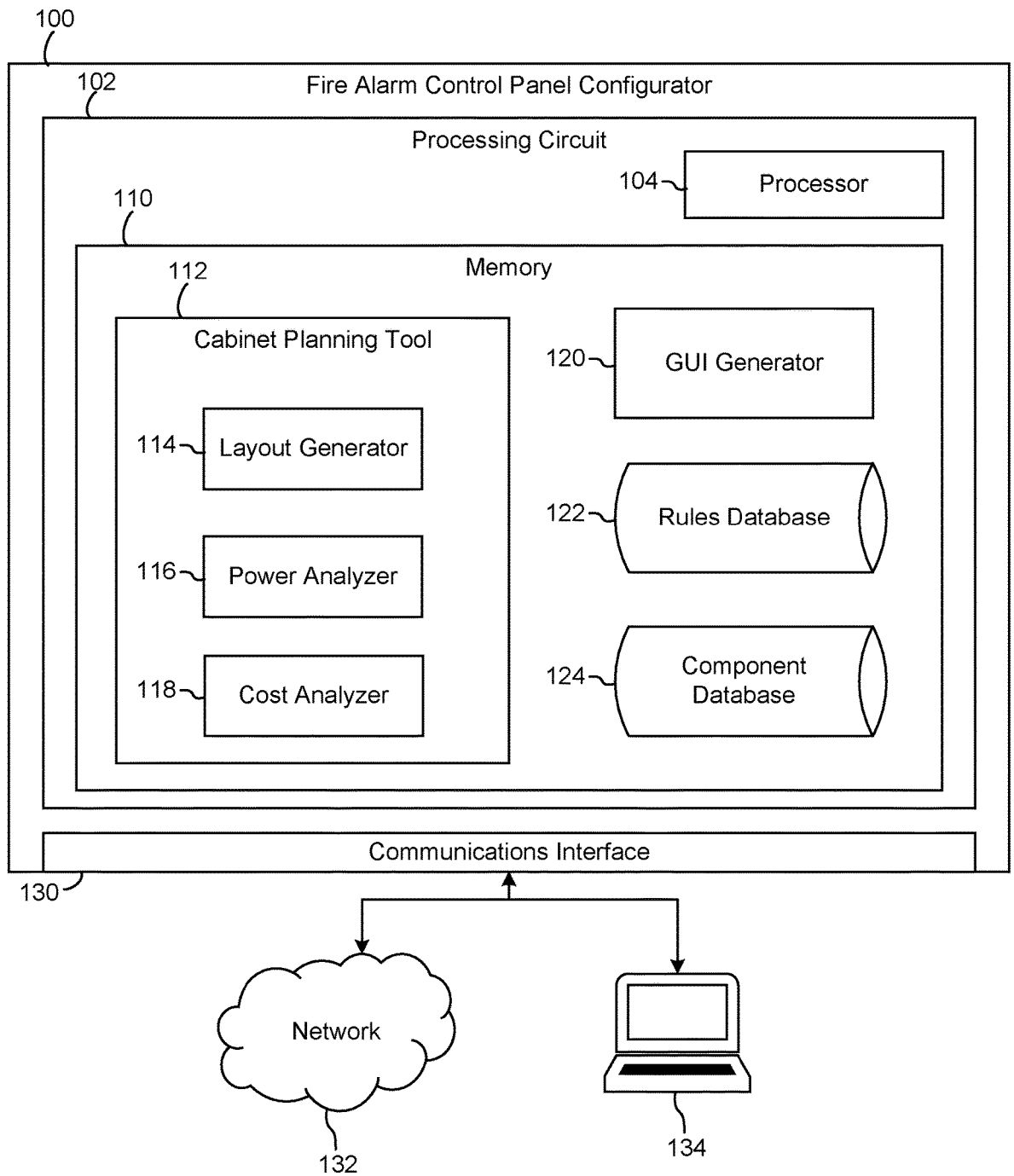
FIG. 1 is a block diagram of a fire alarm control panel configuration tool, according to some embodiments.

Turning first to FIG. 1, a block diagram of an FACP configuration tool is shown, according to some embodiments. The configuration tool, shown as fire alarm control panel configurator 100, is generally configured to determine an optimized FACP layout based on one or more user inputs and/or other configuration parameters. Specifically, configurator 100 may be configured to populate a digital model of a cabinet for an FACP with various component models, to determine a lowest-cost layout for the FACP. In some embodiments, configurator 100 is utilized during the planning stages of construction (e.g., of a building or a fire alarm system) or when upgrading an existing fire alarm system. For example, configurator 100 may be used to determine a layout of an FACP for a new building.

Configurator 100 is shown to include a processing circuit 102 that further includes a processor 104 and a memory 110. While shown as single components, it will be appreciated that processor 104 and/or memory 110 may include multiple components (e.g., multiple processors or multiple memory devices). Likewise, in some embodiments, configurator 100 itself is implemented within a single computer (e.g., one server, one housing, etc.) or can be distributed across multiple servers or computers (e.g., that can exist in distributed locations). In some such embodiments, the distributed servers or computers are communicably coupled via a network 132, described in greater detail below. All such implementations are contemplated herein.

Processor 104 can be implemented as a general purpose processor, an application specific integrated circuit (ASIC), one or more field programmable gate arrays (FPGAs), a group of processing components, or other suitable electronic processing components. Memory 110 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 110 can be or include volatile memory or non-volatile memory. Memory 110 can include database components, object code components, script components, or any other type of information structure for supporting the various activities and information structures described in the present application. According to an example embodiment, memory 110 is communicably connected to processor 104 via processing circuit 102 and includes computer code for executing (e.g., by processing circuit 102 and/or processor 104) one or more processes described herein.

Memory 110 is shown to include a cabinet planning tool 112 configured to determine a layout for an FACP. More specifically, cabinet planning tool 112 may be configured to test a plurality of potential FACP layouts with a given set of components to identify one or more layouts that meet various configuration parameters, such as cost or power requirements. Each possible FACP layout may be referred to herein as a "test set." Cabinet planning tool 112 may be configured to perform a plurality of test sets to identify a panel layout with the lowest associated cost. However, in some embodiments, cabinet planning tool 112 may optimize the panel layout according to other parameters, such as space or energy consumption. For example, cabinet planning tool 112 may identify the most compact layout rather than the most cost-effective layout.

Cabinet planning tool 112 is shown to include a layout generator 114 configured to generate the plurality of possible FACP layouts, or test sets, based on user inputs. In particular, cabinet planning tool 112 may receive user inputs via a user device 134, described in detail below, that define parameters for an FACP. For example, a user may select particular components that they wish to include in the FACP, such as power supplies, controllers, switches, I/O boards, communication boards, displays, input devices, etc. The user may also specify a type, size, construction, etc., of the FACP, along with other parameters that are discussed herein. Based on the user inputs, layout generator 114 may retrieve or otherwise obtain layout rules from a rules database 122 and component parameters from a component database 124.

In some embodiments, rather than selecting particular components, a user may select particular types of components or functionality for the FACP. For example, a user could specify that they want the FACP to include a certain size display, or the user could simply indicate that they want a display included without defining a display size. As another example, the user could specify that they want an FACP that performs certain functions, such as reporting device status via a network. In these embodiments, cabinet planning tool 112 may automatically identify suitable components based on these additional parameters (e.g., component type) defined by a user.

Rules database 122 maintains a plethora of rules that dictate possible layouts of an FACP. For example, these rules may dictate the size and shape of bays in an FACP cabinet, required components in certain/all FACPs, standby and alarm power requirements, bay sizes, the maximum number of allowable addresses, the maximum number of allowable input/output ports etc. In other words, rules database 122 may include a plurality of placement and power requirement rules that define how an FACP can be populated with components. For example, the placement rules may include rules on which components can be placed behind others, which components must be placed in front of others, which components can be below others, etc. In some embodiments, the rules may include limits on the number of components, addresses, input/outputs, required power, size, etc. of a bay or cabinet. For example, there may be a limit of 3000 addresses and 3000 input/outputs per system. As an example, system level rules may dictate that at least one FACP within a fire alarm system includes a CPU and that an entire system has no more than 118 addressed components. System level rules may also include rules that all panels must contain the same types of audio signals and AC voltages. At the panel level, the rules may dictate components that are automatically included in each FACP (e.g., a display, a CPU, a power supply, a chassis, a transponder, a remote annunciator, etc.), and may also dictate a number of individual cabinets that can be included in a single FACP, and a number of total bays that may be included. At the cabinet level, the rules may dictate a type of door (e.g., solid or glass), a maximum number of bays in each cabinet (e.g., three), a minimum number of power distribution modules required, a maximum number of power supplies, etc. At the bay level, rules database 122 may also include rules defining the size of each bay in a cabinet, a number of open slots or blocks in each cabinet, etc.

Figure 2:
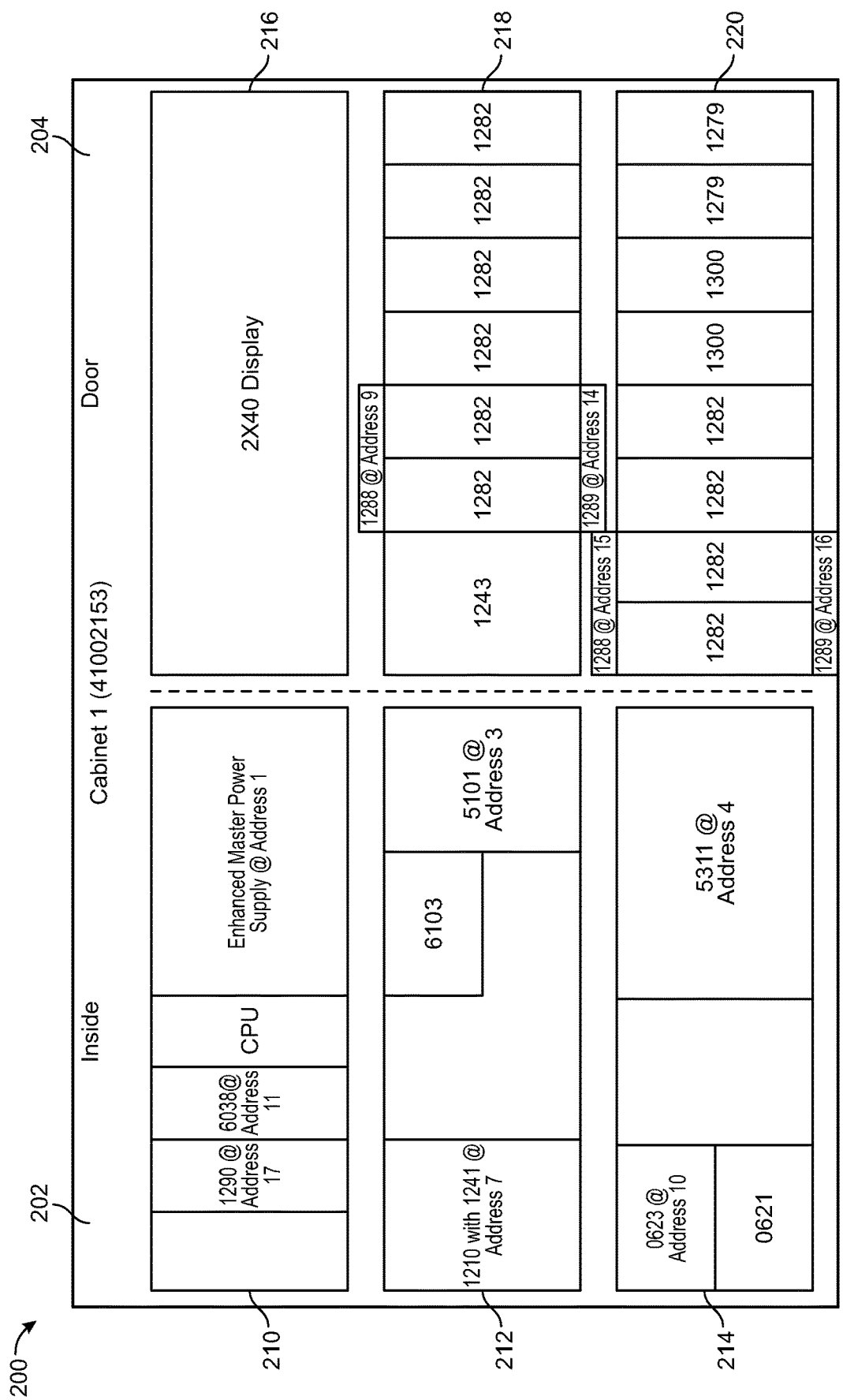
FIGS. 2 and 3 are block diagrams illustrating a layout of an example fire alarm control panel, according to some embodiments.

In some embodiments, as mentioned above, rules database 122 maintains a plurality of component placement rules that define placement constraints for each possible component of the FACP. Component placement rules may include, for example, rules that dictate the interactions between components in an FACP, such as which components are compatible with each other, required spacing between components, arrangement of components (e.g., must be in door or in top slot), etc. These placement rules can ensure that the components selected or identified to populate the FACP are compatible with one another, thereby ensuring that each test set generated by layout generator 114 includes only possible combinations of components. For example, a cabinet may be divided into four planes (e.g., back, mezzanine, behind the door, and front of the door) that are interactive such that a component placed in one plane can affect the placement of components in others. Referring to FIG. 2, the planes may extend into the figure such that the illustrated components or on the front of door plane, and behind them lies the behind door plane, then Mezzanine plane, then the back plane. In some embodiments, a plane is composed of slots or blocks. In some embodiments, a module takes up multiple planes, for example the Back and Mezzanine planes. The placement rules can dictate which components may be placed in which planes, which planes a component interferes with, etc. For example, components that may be limited to the back plane include power supplies, amplifiers, etc. while components that may be limited to the mezzanine plane include message expansion modules, telephone adapters, network media modules, etc. Each plane may have certain mounting requirements that may be represented by one or more rules in rules database 122.

In some embodiments, rules are stored explicitly in rules database 122. Specifically, a rule may be stored for each component (e.g., in component database 124) as a database entry that defines every other compatible component. In other embodiments, the rules can be based on component attributes at affect compatibility. For example, components may be compatible if they operate on the same communications protocol or if they include the same type of connection for physically coupling the components. In this regard, the rules in rules database 122 can define physical attributes of the components as well as functional attributes. Physical attributes could be used to determine the physical arrangement of components within the FACP, for example, whereas functional attributes could be used to determine that the layout satisfies functional requirements for the FACP as defined by the user or as predefined in rules database 122.

In cooperation with the rules obtained from rules database 122, layout generator 114 may obtain component data from component database 124. Component data may include various parameters for the plurality of different components that can be included in an FACP. For example, component data can include a size (e.g., length, width, height) of a corresponding component, along with power consumption data, input/output type (e.g., analog, digital), etc. In some embodiments, component database 124 also includes a cost (e.g., purchase price, manufacturing cost, etc.) associated with each component. Component database 124 may maintain parameters for a wide variety of possible FACP components, and in some cases may be regularly or continuously updated with data from remote systems, such as via network 132. Layout generator 114 may be configured to test various layouts of different components within a FACP cabinet, or in multiple cabinets for a single FACP, to identify one or more possible test sets (e.g., test sets that meet the rules in rules database 122).

A power analyzer 116 may be configured to evaluate each test set generated by layout generator 114 to identify test sets that meet one or more power requirements. The power requirements may define a minimum amount of energy that must be stored by the FACP for use in different scenarios, such as a loss of building power. For example, in a natural disaster (e.g., a tornado) or other emergency (e.g., a fire), a building may lose power but it may be critical to ensure that a fire alarm system is capable of functioning remotely for at least a period of time (e.g., 24 hours), until power can be restored. Thus, power analyzer 116 may determine a quantity, capacity, and/or type of batteries to include in the FACP to meet these requirements. In some embodiments, as described below with respect to FIG. 8C, a user may enter power requirements. For example, the user may define a minimum amount of time that the FACP should be able to operate without utility power and may also define a minimum amount of time that the FACP can operate in an alarm state. In this manner, the FACP should be capable of providing energy to at least a portion of the components of the FACP and/or a fire alarm system for a period of time.

In some embodiments, the one or more power requirements are maintained in rules database 122. In other embodiments, power requirements are automatically determined based on the components identified by layout generator 114. For example, power analyzer 116 may be configured to determine a total power requirement for an entire FACP, based on the one or more possible layouts generated by layout generator 114, in order to determine an amount of reserve energy that the FACP will need to store to meet predefined or user defined power requirements (e.g., minimum operating time, minimum alarm time, etc.). In this example, power analyzer 116 may aggregate the power consumption of each component in an FACP to determine the total power consumption for the FACP, which may be user to define a power requirement.

A cost analyzer 118 may evaluate each possible FACP layout to determine an associated cost. For example, cost analyzer 118 may obtain pricing information for each component included in an FACP, such as from component database 124, and the cost associated with each component in a possible FACP layout may be aggregated to determine a total cost of constructing the FACP. In some embodiments, cost analyzer 118 is also configured to estimate labor costs associated with an FACP (e.g., for installation), which may factor into the total cost of the FACP. In some embodiments, labor costs are stored in rules database 122. Specifically, labor costs may be known for installing different configurations of FACPs, such as based on historical data, and may be labeled according to geographic area as well. As an example, a cost of installing a single FACP cabinet may be known and can be extrapolated for installing multiple cabinets. Labor costs may be based on an estimated number of components, the difficulty of assembly, expected labor hours, etc.

In some embodiments, cost analyzer 118 can estimate labor costs by obtaining (e.g., from a remote system) live or updated cost data from contractors, installers, etc. For example, cost analyzer 118 may query an online database to identify a current hourly rate for installing an electrical panel or FACP, which can be used to estimate the labor for installing an FACP. In this regard, cost analyzer 118 may also be configured to estimate labor costs based on a predefined number of hours associated with the installation of each component or cabinet in an FACP. For example, each type of FACP cabinet may be associated with a predetermine number of installation hours which can be used to estimate labor costs based on current hourly pricing (e.g., a two-hour install at $100/hr would cost $200).

Cost analyzer 118 may also be configured to identify or select one or more possible FACP layouts associated with the lowest cost (e.g., based on panel construction and/or installation). For example, cost analyzer 118 can determine a cost associated with each possible FACP layout, as determined by layout generator 114, and can identify a most cost-effective FACP layout. As an example, an FACP that requires three cabinets may cost more to install than a two cabinet FACP. Thus, it may be more cost effective to choose a layout that results in only two cabinets, if possible. Cost analyzer 118 may be configured to identify the most cost-effective layout for presentation to a user.

In some embodiments, memory 110 can also include a graphical user interface (GUI) generator 120 configured to generate graphical user interfaces (GUIs). These GUIs can provide any sort of information, both text-based and visually, to a user via user device 134, for example. Example GUIs shown below with respect to FIGS. 5-8C can include a configuration interface that allows a user to input parameters for designing an FACP. In some embodiments, GUI generator 120 can also present interfaces that provide 2D or 3D models of an FACP layout, as determined by cabinet planning tool 112.

Still referring to FIG. 1, configurator 100 is also shown to include a communications interface 130 for facilitating communications between configurator 100 and any number of external devices or system. As shown, for example, interface 130 can facilitate communications between configurator 100, network 132, and a user device 134, as described in greater detail below. Interface 130 can be or can include wired or wireless communications interfaces (e.g., jacks, antennas, transmitters, receivers, transceivers, wire terminals, etc.) for conducting data communications. In some embodiments, communications via interface 130 can be direct (e.g., local wired or wireless communications) or via a communications network (e.g., a WAN, the Internet, a cellular network, etc.). For example, interface 130 can include an Ethernet card and port for sending and receiving data via an Ethernet-based communications link or network. In another example, interface 130 can include a Wi-Fi transceiver for communicating via a wireless communications network. In another example, interface 130 can include cellular or mobile phone communications transceivers. In one embodiment, interface 130 is a power line communications interface.

In various embodiments, network 132 is any suitable network for transmitting and receiving data with remote devices and systems. For example, network 132 may be any type of intranet or internet such as a local area network (LAN), a wide area network (WAN), a virtual private network (VPN), etc. In some embodiments, any number of other remote systems or devices may be communicably coupled to network 132 such that the remote systems and devices may communicate with configurator 100. As an example, a remote server or computing system may be coupled to network 132 may handle a portion of the processing or storage required by configurator 100.

User device 134 may be any electronic device that allows a user to interact with configurator 100, such as through a user interface. Examples of user devices include, but are not limited to, mobile phones, electronic tablets, laptops, desktop computers, workstations, and other types of electronic devices. Accordingly, user device 134 generally includes a user input device such, such as a keyboard, a touchscreen display, a keypad, etc. User device 134 may present a graphical user interface on a display and receive user input via the user input device, thereby enabling a user to easily and intuitively interact with configurator 100.

Figure 3:
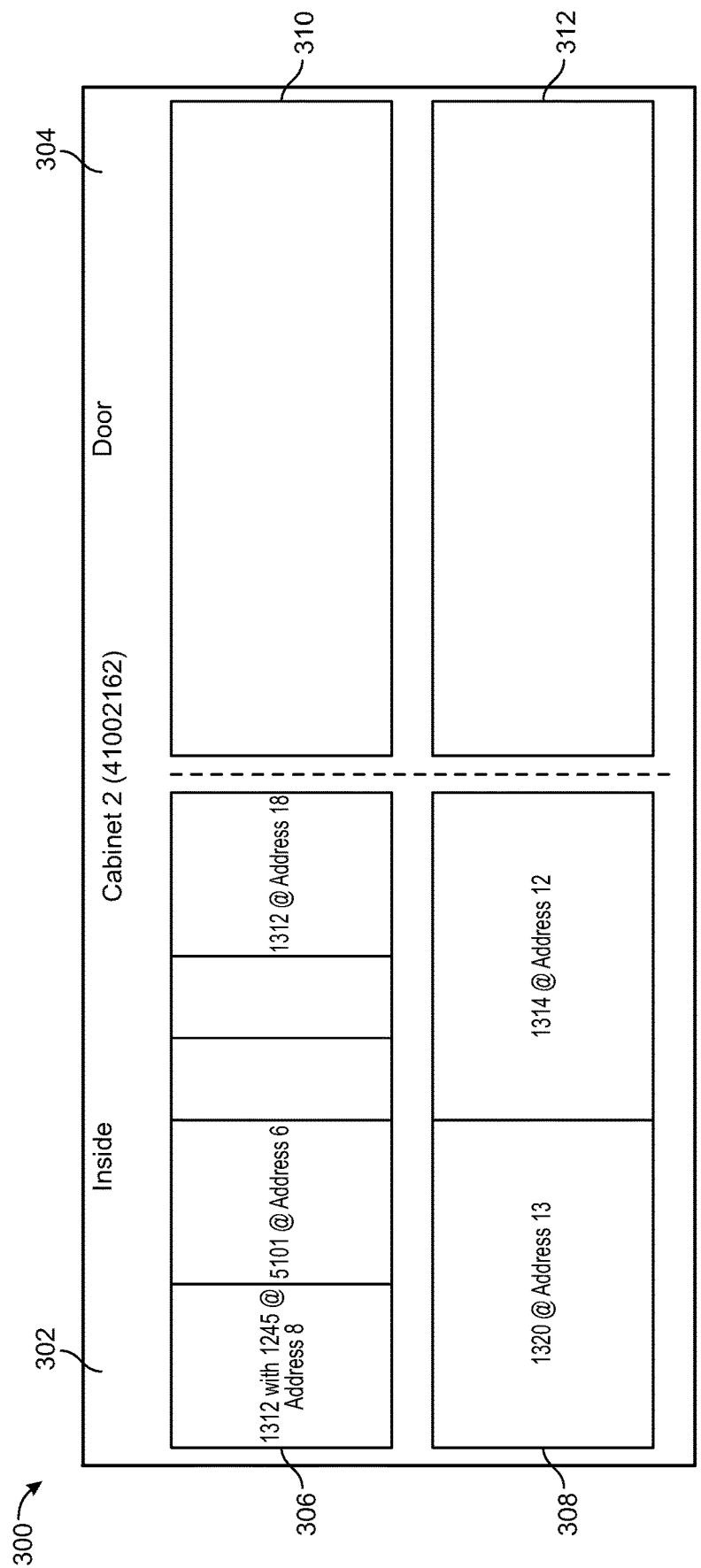

Referring now to FIGS. 2 and 3, block diagrams illustrating the layout of an example FACP are shown, according to some embodiments. In particular, FIG. 2 includes a block diagram of a first cabinet 200 (i.e., panel) and FIG. 3 includes a block diagram of a second cabinet 300 (i.e., panel). In some embodiments, cabinets 200 and 300 may be part of a single fire alarm system and accordingly may each include different components that, together, form a single FACP. In some embodiments, the layout of cabinets 200 and 300, as shown, may be determined by configurator 100 as described above.

Turning first to FIG. 2, cabinet 200 is shown to include six bays 210-220, split between an inside portion 202 and an outside portion 204 (i.e., door side) of cabinet 200. In some embodiments, bays 210-214 may represent an inside portion of bays 216-220; however, bays 210-214 may also be separate from bays 216-220. In any case, each of bays 210-220 may include multiple "slots" for mounting various components. As described above, each component of an FACP (e.g., power supplies, controllers, switches, communication interfaces, etc.) may have a different size and/or shape, and thus may occupy a different amount of space within cabinet 200. For example, bay 210 includes different components including a 24 port I/O board, an RS232 interface, a central processing unit (CPU), and an enhanced power supply. In this example, each of the 24 port I/O board, RS232 interface, and CPU are shown to only occupy one slot of the bay, while the power supply occupies four slots within the bay. Likewise, a 2×40 display occupies all of the available slots in bay 216. Additionally, bays 210-214 are shown to include multiple open slots or positions, allowing for the installation of additional components if needed.

Turning now to FIG. 3, cabinet 300 is also shown to include an inside portion 302 and an outside portion 304 (i.e., door side), each with multiple bays 306-312. However, unlike cabinet 200, cabinet 300 is shown to include multiple empty bays (e.g., bays 310 and 312). In this case, cabinet 300 may be configured to house certain components for an FACP that cannot fit into a single cabinet (e.g., cabinet 200) due to size or rule constraints, as described above. For example, bay 308 of cabinet 300 is shown to include multiple power supplies that take up multiple available slots. Advantageously, configurator 100 may generate multiple potential layouts for cabinets 200 and 300, which may be presented to a user. However, if multiple layouts are possible for an FACP, configurator 100 may also be configured to estimate or determine a cost associated with each layout and may, accordingly, identify a single layout that meets user and/or configuration requirements at the lowest cost.

Figure 4:
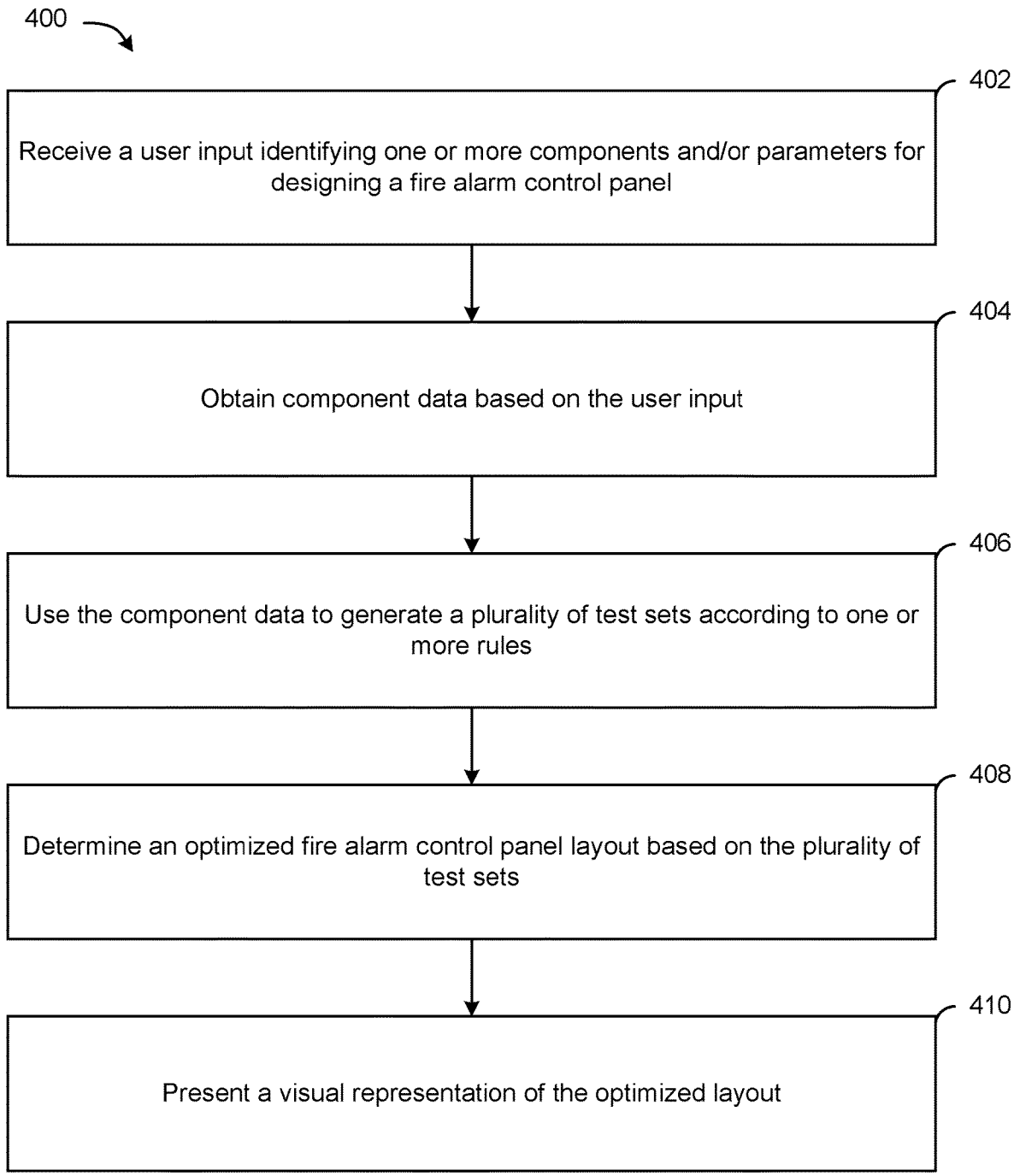
FIG. 4 is a flow diagram of a process for automatically determining a layout of a fire alarm control panel, according to some embodiments.

FIG. 4 is a flow diagram of a process 400 for automatically configuring an FACP, according to some embodiments. As described briefly above, it can be advantageous to automatically determine an FACP layout that is optimized to meet power and cost requirements. Other methods of determine an FACP layout may result in wasted cabinet space, inefficient component selection, and increased costs. Process 400 addresses these issues by generating a plurality of possible layouts, herein referred to as test sets, based on user inputs and rules. In some embodiments, process 400 is implemented by configurator 100 as described above; however, it will be appreciated that all or part of process 400 may be implemented by other systems (e.g., remote computing devices). It will also be appreciated that certain steps of process 400 may be optional and, in some embodiments, process 400 may be implemented using less than all of the steps.

At step 402, a user input selecting one or more components or defining one or more parameters for designing an FACP are received. In some embodiments, the user input is received via a user interface of a user device, such as user device 134. The user input may define various FACP configuration options relating to the panel type and size, power requirements, signal type (e.g., analog or digital), etc. As an example, a user may identify a panel type or function (e.g., master controller, redundant controller, network display unit (NDU), network voice command center (NVCC), transponder, remote annunciator, etc.), a panel package (e.g., back boxes and doors, back boxes with separate doors, without back backs and doors, etc.), a cabinet color (e.g., red, platinum), shipping options (e.g., assembled in the US), digital alarm communicator transmitter (DACT) positioning (e.g., side or plate mounted), number of network access control (NAC) circuits, audio type (e.g., analog, digital, non-audio), amplifier type (e.g., 25V or 75V), number of single or double amplifiers, number of microphones, number of cabinet bays, operating voltage, initiation type, network type, etc. The user may also identify certain components that they wish to include in the FACP, such as amplifiers, network admission control (NAC) cards, microphones, I/O cards, etc.

In some embodiments, a user can also define operating requirements, such as power requirements for the FACP. For example, the user can define a minimum operating time and/or a minimum alarm time in the event of power loss to the FACP. Likewise, in some embodiments, a user may define various configuration requirements (e.g., power requirements, required components, etc.) functionally, such that components that perform the identified functions are automatically selected. For example, a user may indicate that they want the FACP to include wireless network connectivity, and an appropriate wireless network card may be automatically identified for the FACP. Additional components and parameters that can be selected by a user are shown in FIGS. 5-8C.

At step 404, component data is obtained based on the user input. Specifically, a database or remote system may be queried to identify components for populating the FACP that meet the parameters entered by a user. For example, if the user chooses to include a 70V amplifier, a database may be queried to identify possible amplifiers and/or amplifier part numbers that match the user selection. Once a component or components are identified, component data such as the size (e.g., length, width, height, etc.), mounting parameters, layout restrictions, power requirements, priority level, etc., for the component(s) can be identified. Similarly, if the user specifies particular components at step 402, data associated with these components can be obtained.

At step 406, the component data is utilized to generate a plurality of possible FACP layouts or "test sets" based on one or more rules. In some embodiments, the one or more rules are predefined and may be stored in a database (e.g., rules database 122). The one or more rules may define component placement (i.e., layout) and power requirement parameters for an FACP and/or the components of an FACP. The one or more rules may include, for example, a minimum and/or maximum number of cabinets and/or bays for a single FACP, a type of door (e.g., solid, glass) and/or enclosure for the FACP, a maximum number of component addresses, a type of audio signal (e.g., analog, digital), a voltage equipment, etc. Most importantly, however, the one or more rules may define size and layout requirements for the FACP and for components within the FACP. For example, the one or more rules may define a size of each bay of an FACP cabinet and may dictate how each bay is arranged (e.g., into blocks or slots). The one or more rules may also dictate where certain components may be positioned in the FACP (e.g., based on dimensions or proximity to other components), and may define certain required components. For example, the rules may dictate that all FACPs have at least one display, thereby requiring a glass door. As another example, the rules may dictate that certain components, such as power supplies that generate a large amount of heat, may require additional fans, etc. Examples of the rules used to generate possible FACP layouts are shown in detail in the attached Appendix A.

In some embodiments, the one or more rules may also establish a priority order for components based on the components priority level. The priority level may be based on size, power requirements, connection requirements, user preference, the number of available positions for a component, etc. In some embodiments, the priority level is the known as the placement statistic and is calculated according to process 1600 in FIG. 16. The one or more rules may use the priority levels to determine the order of component placement such that high priority components are placed first and low priority components are placed second.

To generate the plurality of test sets, the components identified at step 404 are "tested" in a digital FACP layout. In other words, a plurality of layouts are generated and a subset of the layouts that meet the one or more rules and that are feasible for construction may be identified as possible layouts. In some cases, there may be only one possible layout that satisfies all of the applicable rules. In other cases, there may be multiple possible layouts that satisfy all of the applicable rules. In some embodiments, step 406 also includes determining a capacity, number, and/or type of batteries to include in each possible FACP layout, in order to meet reserve power requirements for the FACP. As described above, for example, an FACP may be required to maintain adequate reverse energy to power a fire alarm system for a length of time (e.g., a few hours, a day, etc.). Thus, the power requirements for the FACP may be factored into the generation of the plurality of test sets.

At step 408, a particular layout for an FACP is determined based on the plurality of possible layouts or test sets. In some embodiments, the particular layout is the only layout that meets all of the one or more rules at step 406. In other embodiments, each possible layout generated at step 406 is analyzed to identify a single layout that meets an optimization parameter, such as size or cost. In particular, it may be advantageous to identify a single possible FACP layout that is associated with a lowest cost to construct and/or install. For example, the FACP layout may maximize usable space in each FACP cabinet and/or may use certain components that cost less than others. As another example, a three bay FACP cabinet may cost more than two, two-bay cabinets. Thus, it may be most cost-effective to identify an FACP layout utilizing the two, two-bay cabinets.

Figures 8A, 8B:
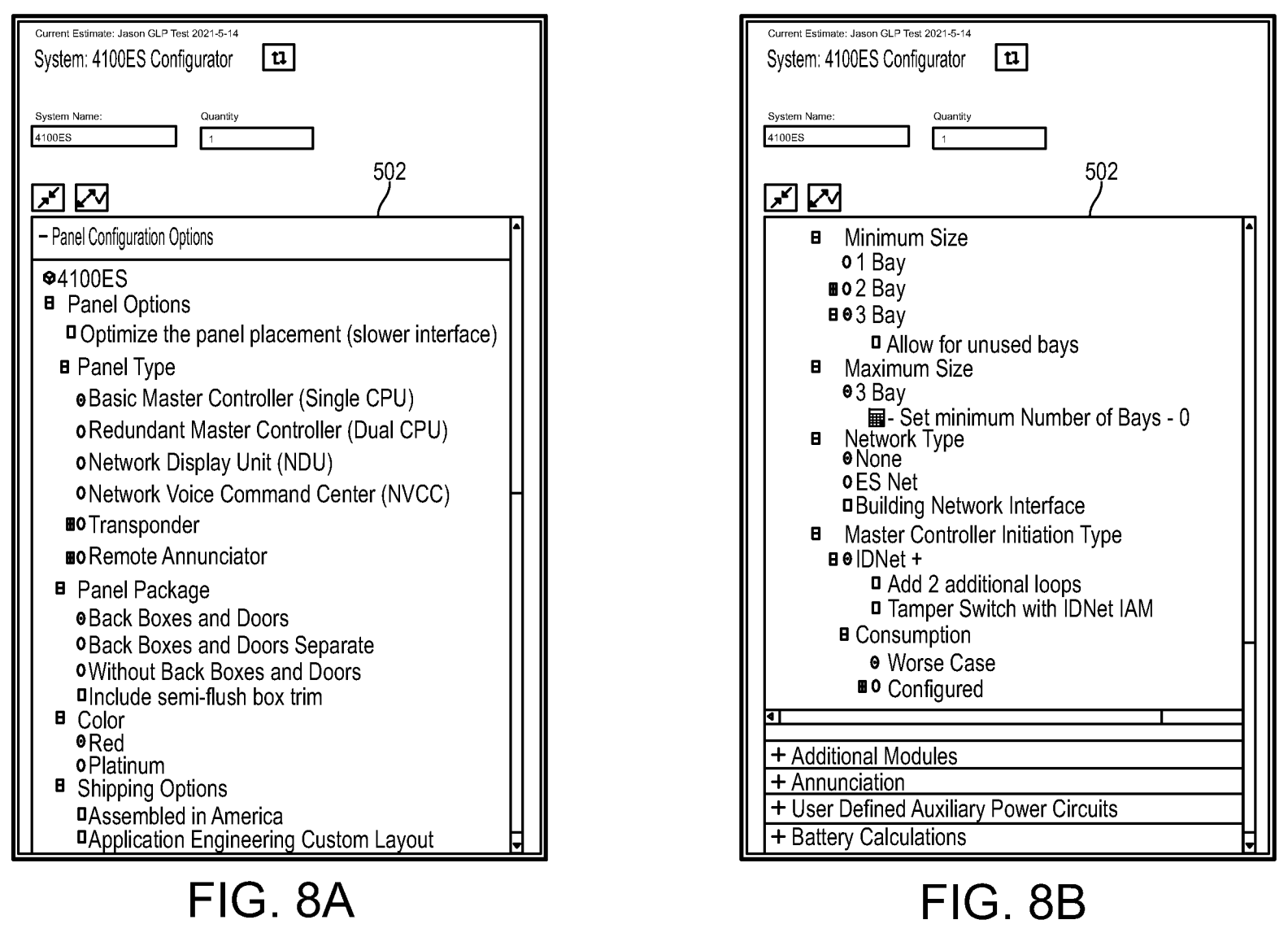
Figure 8C:
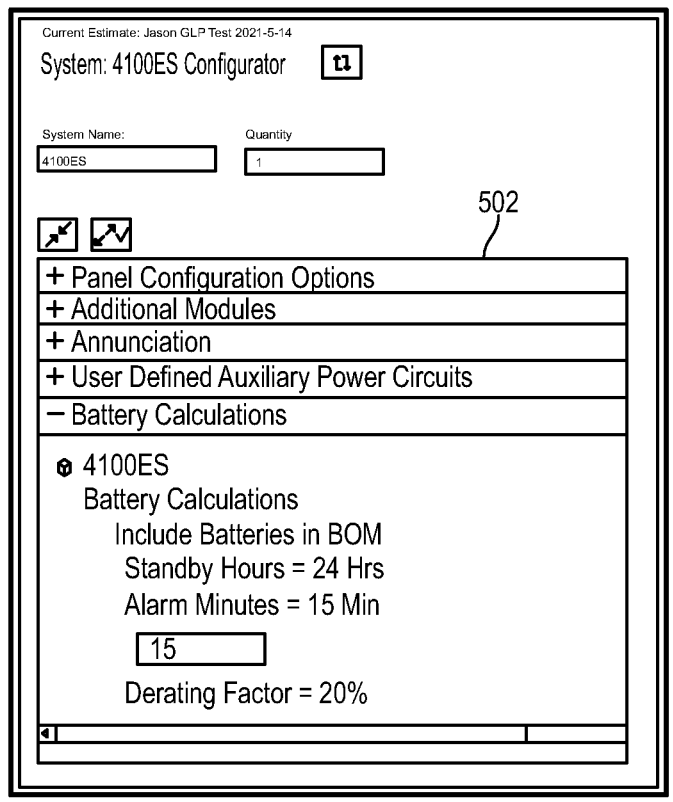

At step 410, a visual representation of the optimized FACP layout is presented to a user, such as via a graphical user interface (GUI). In some embodiments, the visual representation includes a 2D and/or 3D model of the FACP, as shown in FIG. 8C. In some embodiments, the GUI may also include a breakdown of the particular components included in the optimized FACP layout. For example, the GUI may present a bill of materials listing each component. In some embodiments, the GUI may present (e.g., within the bill of materials) a cost estimate for the FACP. For example, the cost estimate may indicate the purchase price of each component, along with estimated installation costs, etc.

User Interfaces

Figure 5:
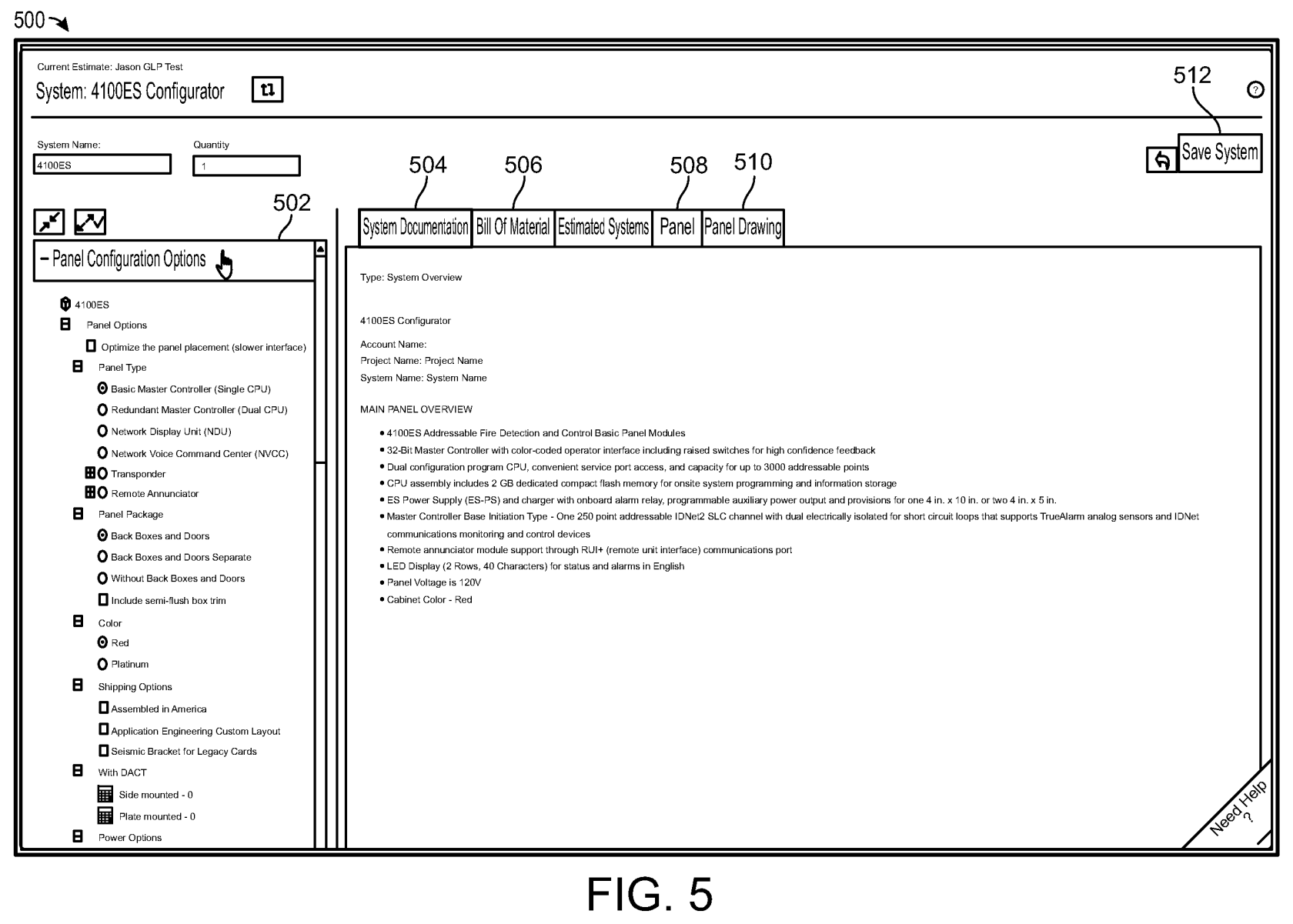
Figure 6:
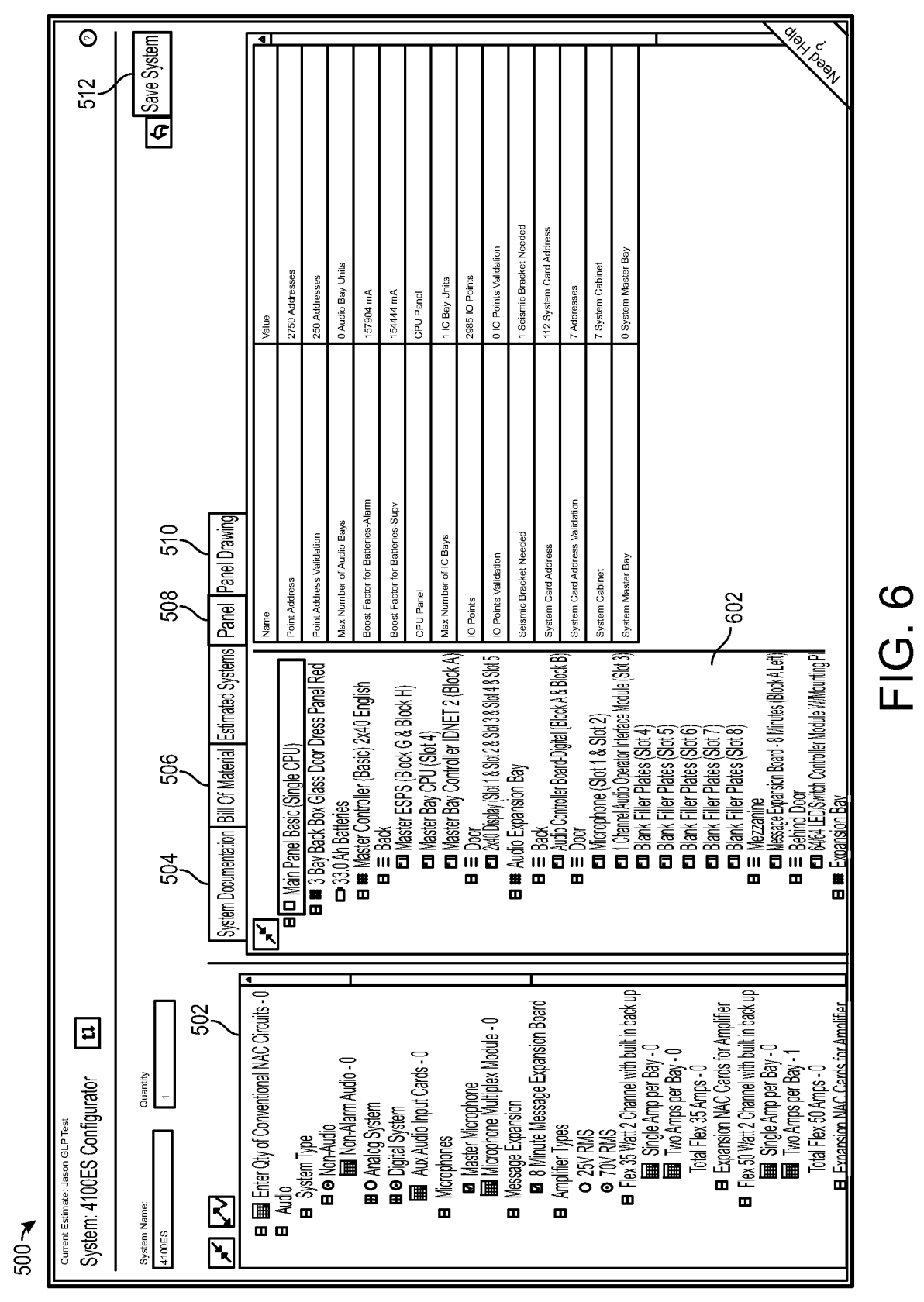
Figure 7:
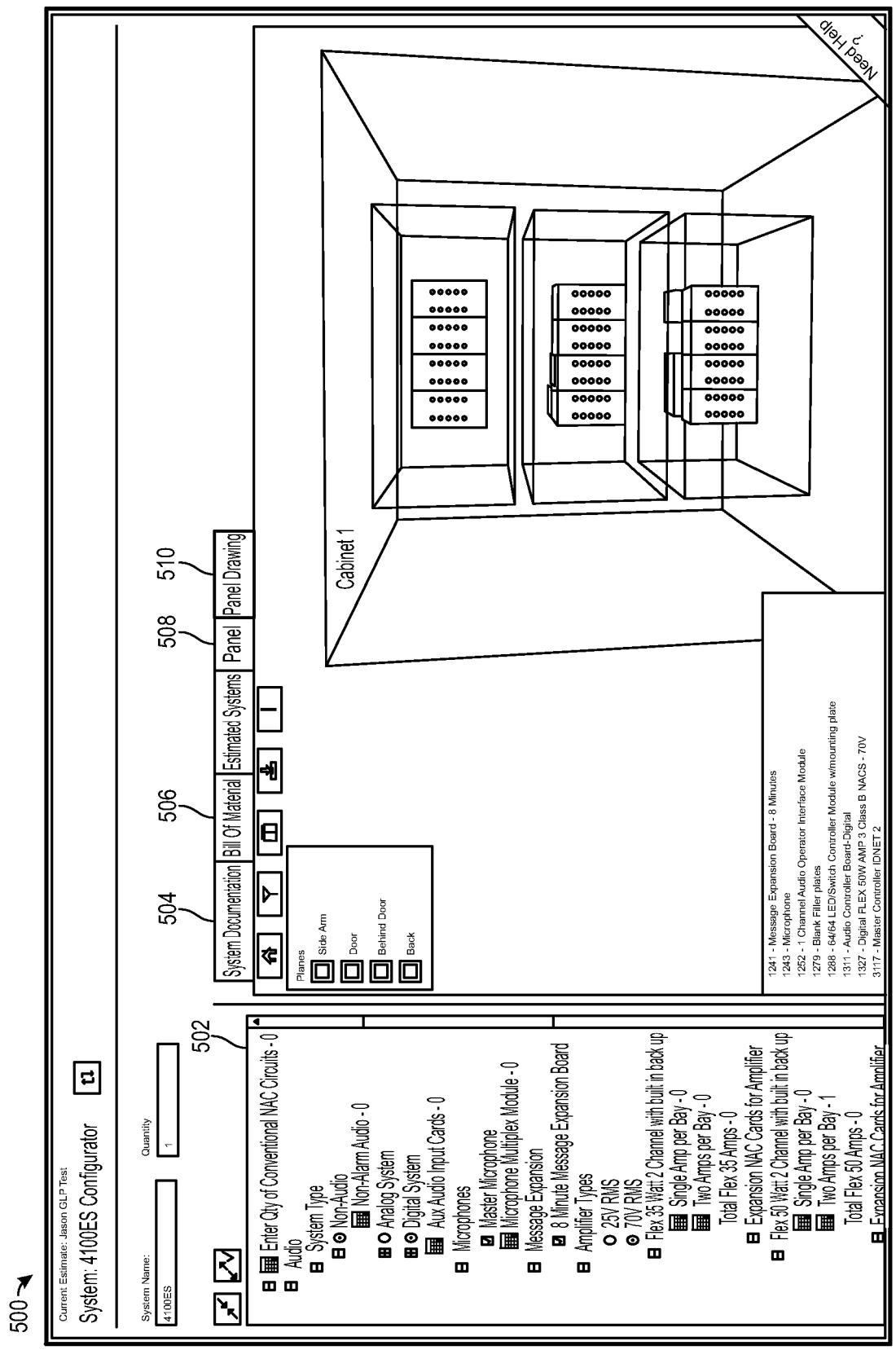
FIG. 7 is an example interface showing a 3D fire alarm control panel viewer, according to some embodiments.

Referring now to FIGS. 5-7, example interfaces for configuring an FACP are shown, according to some embodiments. In particular, FIGS. 5-7 shown various interfaces of an FACP configurator that allows a user to select various components and/or parameters for a new FACP, and subsequently presents the user with a layout, bill of materials, and cost estimate for the FACP, among other information. Turning first to FIG. 5, an example interface 500 of the FACP configurator is shown, according to some embodiments. Interface 500, and any of the other interfaces described herein, may be generated by GUI generator 120 and may be presented via user device 134, for example.

Interface 500 is shown to include a menu 502, shown on the left-hand side of interface 500, which provides a list of possible FACP configuration options. In some embodiments, menu 502 may include a plurality of nested menus (e.g., drop-down menus) that can be selected to view additional configuration options. As shown, for example, a user may be able to select a panel type, a panel package, a panel color, shipping options, etc., to specify various components or parameters of the FACP being designed. In the example shown, a user has selected a "Basic Master Controller" panel that includes only one central processing unit (CPU); however, the user may also utilize interface 500 to design other types of panels such as network display units (NDUs), network voice command centers (NVCCs), transponders, annunciators, etc. The user has also selected a panel package that includes back boxes and doors and has specified a "red" cabinet.

In some embodiments, selecting any of the options shown in interface 500 may filter the available components or parameters that can be selected in menu 502. For example, selecting a specific cabinet color may limit the possible panel layouts, thus limiting the components or parameters that are shown in menu 502. Turning briefly to FIGS. 8A-8C, various options that may selected from menu 502 are shown in greater detail, according to some embodiments. In FIG. 8B, for example, a user may be able to select a minimum and/or maximum FACP size, represented as a number of bays. In this example, the user has set a minimum panel size of three (3) bays. The user may also specify network type, master controller initiation type, etc. The user may also be able to select additional drop down menus to specify additional modules or components to be included in the FACP, annunciation parameters, auxiliary power circuits, etc.

As shown in FIG. 8C, a user may also specify parameters to perform battery or power requirement calculations, as briefly described above. In this example, a user can specify whether batteries are included in the bill of materials that is generated for the FACP, and can also specific an amount of time (e.g., in minutes, hours, etc.) that the FACP should be able to operating in a standby mode or an alarm mode. For example, the user has specified that the FACP should be able to operate in standby for 24 hours and should be able to provide until to 15 minutes of power in an alarm state. In other words, the FACP should have enough reserve energy (e.g., stored in batteries) to operate at least the alarm components (e.g., lights and sirens) of a fire alarm system, ensuring adequate operation if power is cut off from a utility provider (e.g., in the event of a power outage).

Referring again to FIG. 5, a "Systems Documentation" tab 504 may present an overview of the FACP being designed based on the components and parameters selected from menu 502. In this example, tab 504 shows a project and system name, along with a listing of the components selected or identified for the panel. In some embodiments, the panel overview may list parameters or components selected directly from menu 502. In some embodiments, at least a portion of the components displayed in the overview are automatically selected (e.g., by configurator 100) based on the parameters selected by a user. For example, the user may select "Basic Master Controller," as shown, and tab 504 may be updated to list a specific master controller (e.g., "32-bit Master Controller with color-coded operator interface . . . ").

Once a panel is configured, or at any point during configuration, the user may select a "Bill of Materials" tab 506 to be presented with a bill of materials (BOM) for the FACP. The BOM may be a listing of all of the components that are used to populate the panel, including parts that are not shown on tab 504. For example, the BOM may list specific part numbers for various components, and may also list supporting components such as brackets, power supplies, etc. In some embodiments, the BOM includes an estimated price list for the components of the panel. Component pricing may be known or estimated based on stored or historical data, or in some cases may be actively retrieved when a component is selected. For example, a website or other online source may be queried for up-to-date pricing on various components.

In some embodiments, a user can select a "Panel" tab 508, shown in FIG. 6, to be presented with a more in-depth analysis of the FACP being designed. Specifically, tab 508 may list technical details of the panel, such as available addresses, number of bays, number of input/output (IO) points, etc. A user may select a portion of the panel to view additional information on from a secondary menu 602. Menu 602 is shown to include a breakdown of the components selected for the FACP, arranged based on a position within the panel. In some embodiments, the components may be presented in nested menus, similar to menu 502. As shown, for example, a basic main panel is configured as a "3 Bay Back Box Glass Door Dress Panel Red," defining various parameters of the panel (e.g., size, type, color, etc.).

The example panel includes 33.0 Ah worth of battery energy, which may be stored in one or more individual batteries. In some embodiments, this battery energy parameter, and thereby the number and/or size of batteries in the panel, may be adjusted based on the various components or parameters selected for the panel. For example, setting a longer standby energy requirement (e.g., 48 hours instead of 24 hours) may require a greater amount of stored energy. Thus, menu 602 may reflect updates to power requirements or other parameters. As shown, menu 602 also includes breakdown of each bay in the example three bay panel. For example, a first bay includes a master ESPS, a master CPU, and a master controller in the back portion of the panel, and 2×40 display on the front (i.e., door) portion of the panel.

In some embodiments, a user can select a "Panel Drawing" tab 510, shown in FIG. 7, to be presented with a 2D and/or 3D model of the FACP being designed. In the example shown, the panel is represented as a 3D model, illustrating a three bay panel populated with various components. Components may be shown in the panel as colored or patterned objects (e.g., blocks) indicating a position of the component within the panel. In some embodiments, a user can select a particular component (e.g., by clicking on the component in the 3D model viewer) to view additional information about the component. For example, the user may be presented with a part number or other parameters associated with the component. The user may also be able to adjust the 2D/3D view shown, such as by turning on/off various planes (e.g., side, door, back, etc.). For example, turning off the "door" plane may hide any components on the "door" (i.e., outside) portion of the panel.

Example Process

Figure 9:
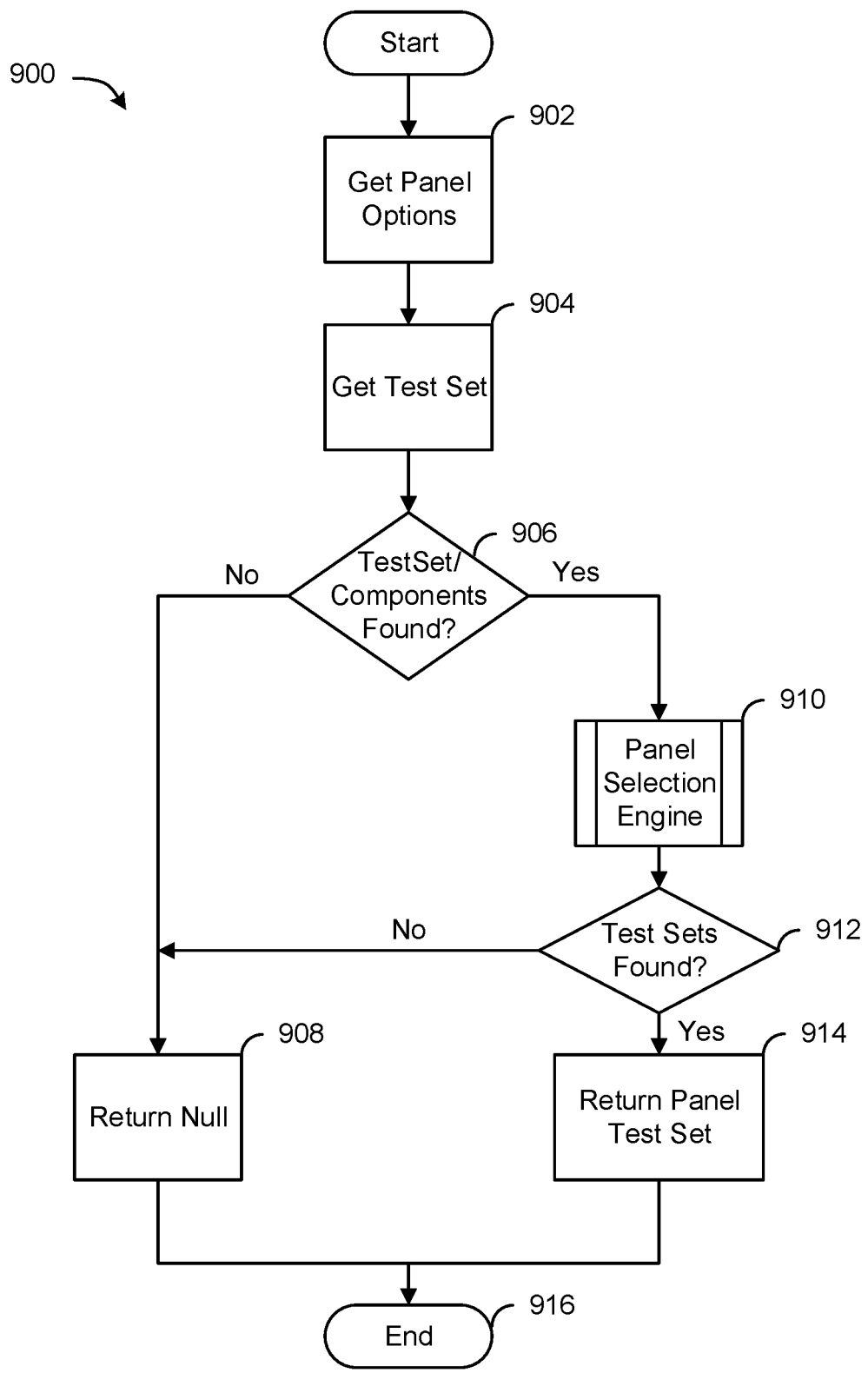
FIG. 9 is a flowchart of an example process for automatically determining a layout of a fire alarm control panel, according to some embodiments.

Referring now to FIGS. 9-16, flowcharts illustrating an example process for automatically configuring an FACP are shown, according to some embodiments. In particular, FIG. 9 illustrates a high-level overview of an example process for automatically configuring an FACP, and FIGS. 10-16 illustrate example embodiments of sub-processes that may also be performed. Turning first to FIG. 9, a flow diagram of an example process 900 for automatically configuring an FACP is shown, according to some embodiments. As described above with reference to FIG. 4, process 900 generates possible test sets based on user inputs and rules automatically and selects the most efficient test set based on user inputs or configuration parameters. In some embodiments, process 900 is implemented by configurator 100 as described above; however, it will be appreciated that all or part of process 900 may be implemented by other systems (e.g., remote computing devices). It will also be appreciated that certain steps of process 900 may be optional and, in some embodiments, process 900 may be implemented using less than all of the steps. It should further be appreciated that the order of some steps in process 900 may be varied.

At step 902, panel options are obtained. In some embodiments, step 902 is similar and/or identical to step 402. The panel options may be a user input, and the user input may define various FACP configuration parameters relating to the panel type and size, power requirements, signal type, etc. Additionally and/or alternatively, the panel options may include operating parameters for the FACP. At step 904, a test set is obtained. Step 904 may be the same or similar to step 404 of process 400. The test set may include a list of components based on the panel options. At step 906, if a test set or selected components cannot be obtained from the panel options and/or cannot be found, process 900 advances to step 908. For example, if a component cannot be identified, or data for a component cannot be retrieved from the component database 124, process 900 may proceed to step 908 and return a null value to the user before ending at step 916.

Returning back to step 906, if an initial test set is found, and/or it is possible to generate a test set based on the panel options, including successfully finding information on all necessary components, process 900 proceeds to step 910. At step 910, a panel selection engine is initiated. Step 910 may be the same or similar to steps 406 and 408 of process 400, and the panel selection engine of step 910 is explained in further detail below with reference to FIG. 10. In brief, the test set data obtained in step 904 is used to generate one or more test sets. At step 912, process 900 checks if test sets can be generated by the panel selection engine. If no test sets are or can be generated, the process proceeds to step 908 and returns a null value before ending at step 916. If test sets are or can be generated, at step 914 the panel test set is returned and the process ends at step 916.

Figure 10:
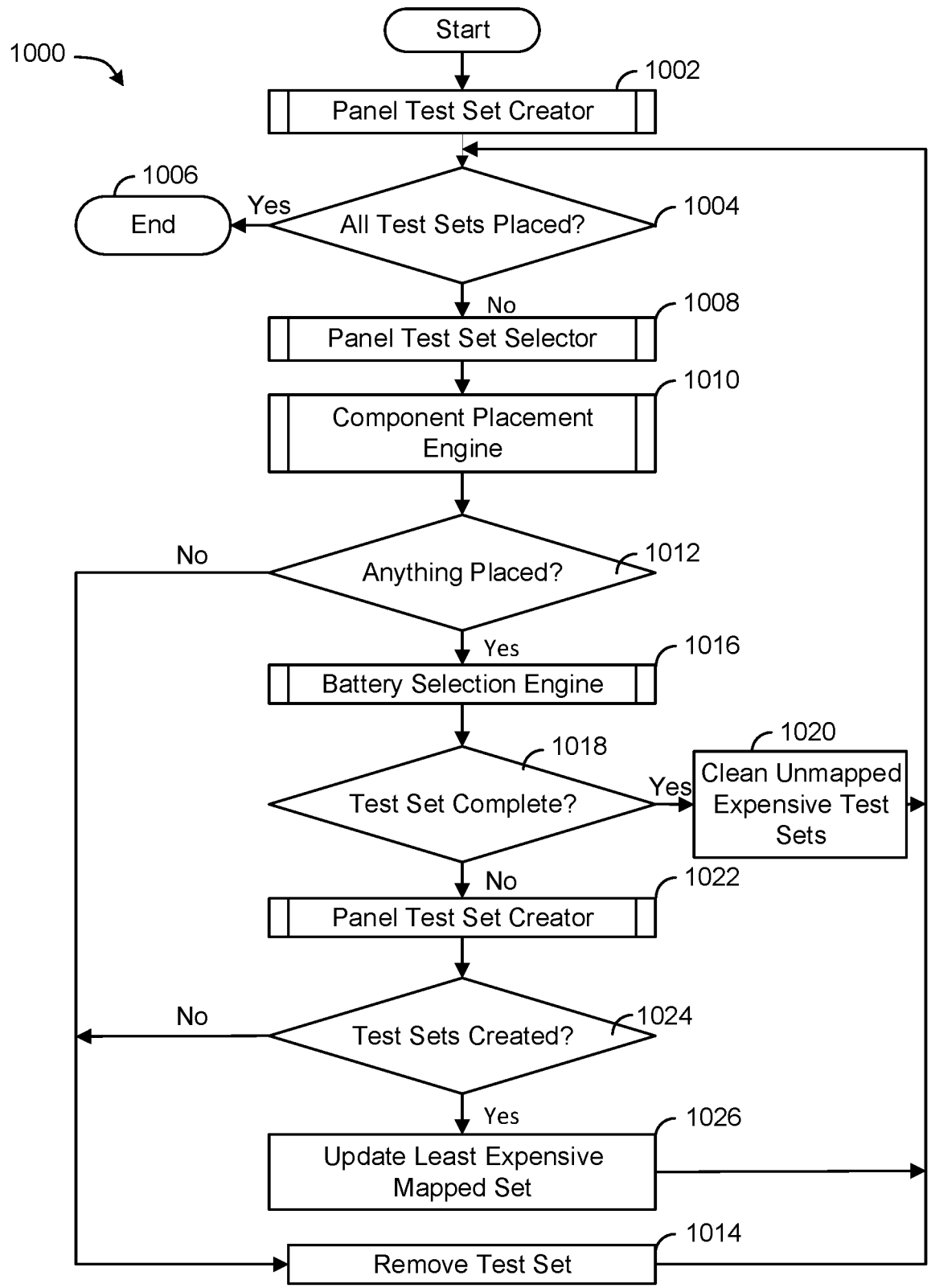
FIG. 10 is a flowchart of an example sub-process for selecting a layout for a fire alarm control panel, according to some embodiments.

Turning now to FIG. 10, an exemplary flow chart of process 1000 for a panel selection engine is shown, according to some embodiments. As described above with reference to FIG. 9, the panel selection engine of process 1000 may be used at step 910 of process 900 to provide test set(s) to process 900. In some embodiments, process 1000 is implemented by configurator 100 as described above; however, it will be appreciated that all or part of process 1000 may be implemented by other systems (e.g., remote computing devices). It will also be appreciated that certain steps of process 1000 may be optional and, in some embodiments, process 1000 may be implemented using less than all of the steps. It should further be appreciated that the order of some steps in process 1000 may be varied.

At step 1002, the panel test set creator is initiated. The panel test set creator is explained below in further detail with reference to FIG. 11. In some embodiments, the panel test set creator returns a list of one or more test sets based on the panel options, including the required components, with varied numbers and positions cabinets, bays, and power supplies. At step 1004, if all components in all the returned test sets are placed, process 1000 ends at step 1006. If a component in a returned test set is not placed, at step 1008 the panel test set selector is initiated. For example, when process 1000 initially begins, the test sets may only include lists of components, and the components must be placed by component placement engine, battery selection engine, etc. As each test set is processed and its components are placed, fewer test sets at step 1004 will have unplaced components. Eventually, all test sets will be placed and the panel selection engine will provide to process 900 a selected test set that is the optimal configuration according to the panel options and rules. At step 1008, in some embodiments, the panel test set selector is provided the test sets with the unplaced component(s) from the panel test set creator. The panel test set selector may then select a first test set with unplaced components based on a selected criteria. The criteria be parameters based on the user inputs or rules for configuring an FACP, and in some embodiments may be cost per component, components per bay, etc. For example, the panel test selector may select the cheapest test set in the list. In some embodiments, the criteria is selected by the user as part of the panel options provided in step 902 of process 900. By selecting test sets according to the chosen parameter before component placement, the panel selection engine can intelligently process the test sets most likely to be the optimal test set first. The panel test set selector is explained in further detail below with reference to FIG. 12.

Once the panel test set selector returns a test set with one or more unplaced components from the list of test sets with unplaced components provided to it, at step 1010 the component placement engine is initiated. The component placement engine may be configured to generate and/or select a placement for each unplaced component in the provided test set. The component placement engine is explained in further detail below with reference to FIG. 13. At step 1012, if the component placement engine is unable to place a component, for example no FACP layout can satisfy the user input and the rules, process 1000 proceeds to step 1014 and the test set is removed from the list of test sets at step 1014 and then process 1000 returns to step 1004, where the list of test sets is checked again to determine if another test set exists with unplaced components. The component placement engine may be unable to place a component according to any number of rules are limitations. For example, if the component is too large for the remaining space in the cabinet, and the max number of cabinets has been reached, the component placement engine would be unable to place the component and would return a no at step 1012.

Figure 11:
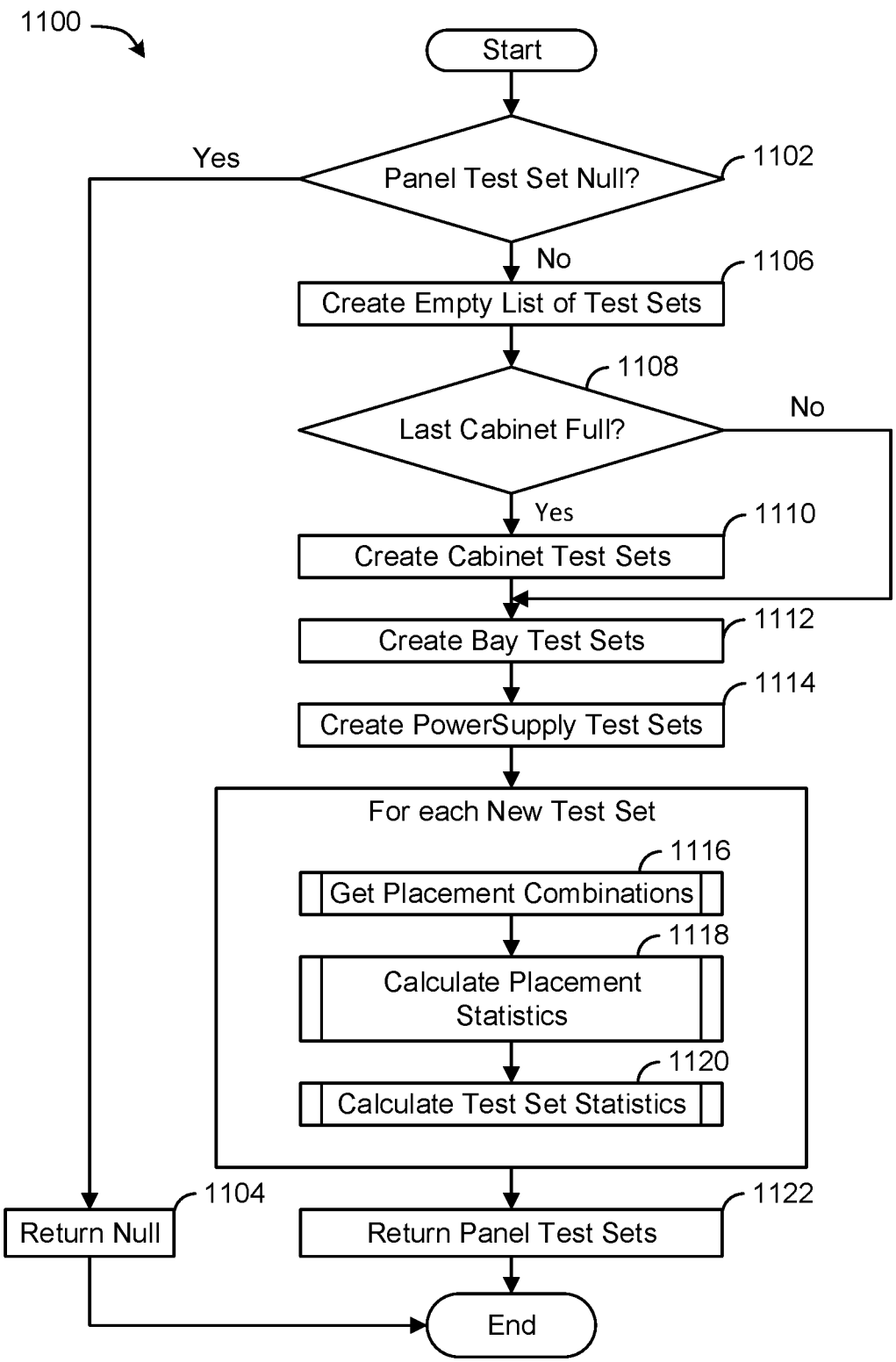
FIG. 11 is a flowchart of an example sub-process for creating layouts for a fire alarm control panel, according to some embodiments

At step 1012, if the component placement engine is able to place the unplaced components in the test set, at step 1016 the battery selection engine is initiated. In some embodiments, the battery selection engine may determine a quantity, capacity, and/or type of battery to include in the selected test set based on the panel options, rules, and or operating characteristics of the given test set. The battery selection engine may be performed in and/or perform a function similar to power analyzer 116 of FIG. 1. At step 1018, if the test set is now complete, at step 1020 any unmapped test sets that are inferior to the mapped test set as measured by the chosen parameter, for example cost, are cleaned from the test set list, and process 1000 then returns to step 1004 to check anew if all test sets are complete and mapped. At step 1018 if the test set is not complete, it is returned to the panel test set creator at step 1024. The panel test set creator may create a list of new test sets based on the initial test set, with the new test sets only being selected if they perform the same or better than the previous test set according to the selected criteria, for example the test sets are cheaper than the initial test set. FIG. 11 below explains the panel test set creator in further detail.

At step 1024, if no new test sets were created by the panel test set creator, than the initial test set that remains incomplete is removed from the list of test sets at step 1014 and process 1000 returns to step 1004. If at step 1024 new test sets are created, than at step 1026 the test sets are used to update the list of test sets, i.e., the least expensive mapped set of test sets, that were originally generated by the panel test creator at step 1002, and process 1000 again returns to step 1004. In this manner, the panel selection engine of process 1000 begins with a list of test sets generated in step 1002 that is recursively diminished until an optimal test set for an FACP is selected.

Turning now to FIG. 11, an exemplary flow chart of process 1100 of a panel test set creator is shown, according to some embodiments. As described briefly above, the panel test set creator illustrated by process 1100 creates a list of test sets with unique placement combinations, i.e., various cabinets, bays, and power supplies. Each test set created has placement statistics and test set statistics calculated which are then used by the panel selection engine of process 1000 and/or the panel selection service of process 900 to select an optimal test set from the generated list. The optimal test panel may be selected according to the chosen parameter in the same or similar manner as step 408 of process 400. In some embodiments, process 1100 is implemented by configurator 100 as described above; however, it will be appreciated that all or part of process 1100 may be implemented by other systems (e.g., remote computing devices). It will also be appreciated that certain steps of process 1100 may be optional and, in some embodiments, process 1100 may be implemented using less than all of the steps.

At step 1102 the panel test set is checked to determine if it is empty. If yes, process 1100 proceeds to step 1104 and the panel test set creator returns a corresponding null value. For example, depending on the panel options (i.e., the components, parameters, functions, operating requirements, etc.) it may not be possible to generate a test set and the creator will return a null value. If at step 1106 the panel test set is not empty, process 1100 proceeds to step 1106 and creates an empty list of test sets. A test set from the empty list of test sets is then selected at step 1108 and checked to determine if the last cabinet in the test set is full. If the cabinet is not full, at step 1110 cabinet test sets are created by modifying the number and/or size of cabinets. In some embodiments, only cabinets which meet the panel options requirements and (in the case of the panel test creator working from preexisting test sets as in step 1022 of process 1000) that are of equal or lesser value than the cabinet in the previous test set are created. If the cabinet at step 1108 is already full, the cabinet size cannot be varied and process 1100 skips steps 1110 and proceeds to step 1112.

At step 1113, the provided test sets are processed and used to create more test sets of with varied number of bays. In some embodiments, bays are only selected if the necessary resources are present and the bays are of equal or lesser priority than the bay in the previous test set. Priority may be determined based on cost, size, function, necessity, user preference or any other parameter. At step 1114, more test sets are created with power supplies which meet the requirements of the system. The power supplies may be selected in a manner similar or identical to how the power analyzer 116 operates.

At step 1116, for each new test set, placement combinations are retrieved. The placement combinations are unique layouts in each bay and cabinet for the required components. The placement combinations may be determined in a manner similar to step 406 of process 400. For example, a placement combination may include a display and a telephone hookup in the same bay, while another placement combination may include them in separate bays. The process for generating the placement combinations is further described in greater detail below with reference to FIG. 15. At step 1118, for each new test set and placement combination the placement statistics are also calculated. The processes for calculating placement statistics is explained in further detail below with reference to FIG. 16 but in brief, the statistics are calculated based on the number of other placement options for a component and the number of components that are impacted by a given placement combination. At step 1120, for each new test set the test set statistics are calculated. In some embodiments, the test set statistics may be provided to other processes such as processes 900 and 1000 to aid in selecting an optimal test set. At step 1122, the created list of test sets if returned. For example, Returning now to FIG. 10, the list of test sets is provided at step 1002 for the panel selection engine to choose from.

Figure 12:
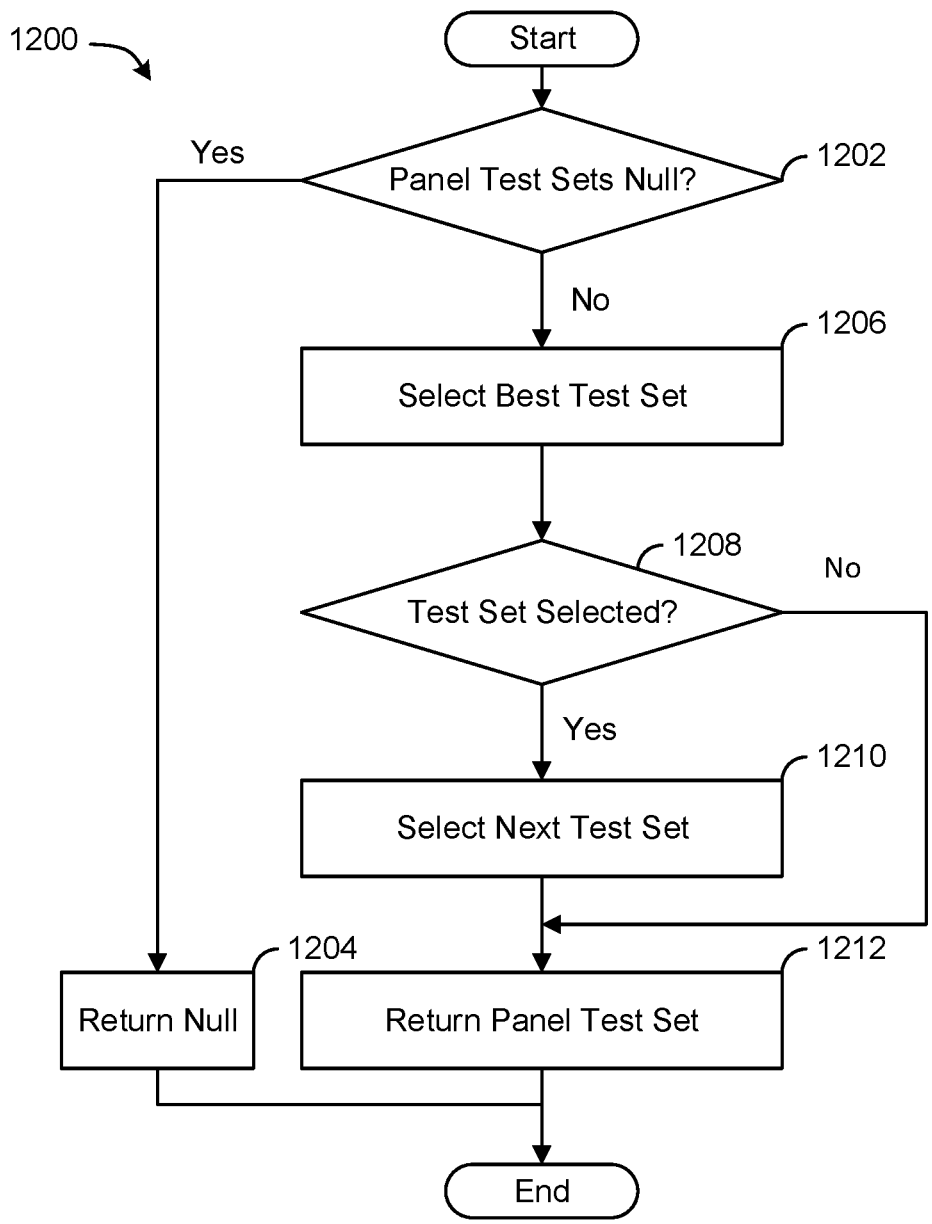
FIG. 12 is a flowchart of an example sub-process for selecting a test set of a layout for a fire alarm control panel, according to some embodiments

Turning now to FIG. 12, a flow chart of an example process 1200 illustrating the panel test set selector is shown, according to some embodiments. As described briefly above, the panel test set selector illustrated by process 1200 is provided a list of test sets with unmapped components, selects a test set from that list based its fit to one or more parameters, and provides the selected test set to the module placement engine in step 1010 of process 1000. The panel test set selector may repeat this process for each test set in the list until all have been selected. In some embodiments, process 1200 is implemented by configurator 100 as described above; however, it will be appreciated that all or part of process 1200 may be implemented by other systems (e.g., remote computing devices). It will also be appreciated that certain steps of process 1200 may be optional and, in some embodiments, process 1200 may be implemented using less than all of the steps.

At step 1202, the panel test set selector checks if the test set list is empty. If the list is empty, at step 1204 a null value is returned and process 1200 ends. If the test set is not empty, process 1200 proceeds to step 1206 and selects a best test set from the list. In some embodiments, the best test set is selected based on a configuration parameter, for example cost per component, components per bay, power requirements, etc. At step 1208, if a test is selected, it is provided to the module placement engine as shown in step 1010 of FIG. 10 at step 1212, and then the next test set is selected based on the selection criteria and that test is also provided. If at step 1208 no test set is selected, then the panel test set selector returns the past selected test set and process 1200 ends. For example, referring back to FIG. 10, process 1200 may order the test sets in the list of unmapped test sets provided to it by step 1008 in process 1000 according to cost. Process 1200 then selects the cheapest test set from the list of unmapped test sets and provides that test set to the component placement engine at step 1010 of process 1000. Process 1200 may then provide the next cheapest test set, repeating until process 1000 finds an optimal test set and terminates. In this manner, process 1200 orders the testing of FACP layouts so that candidate test sets most likely to be the optimal test set are mapped prior to less likely test sets.

Figure 13:
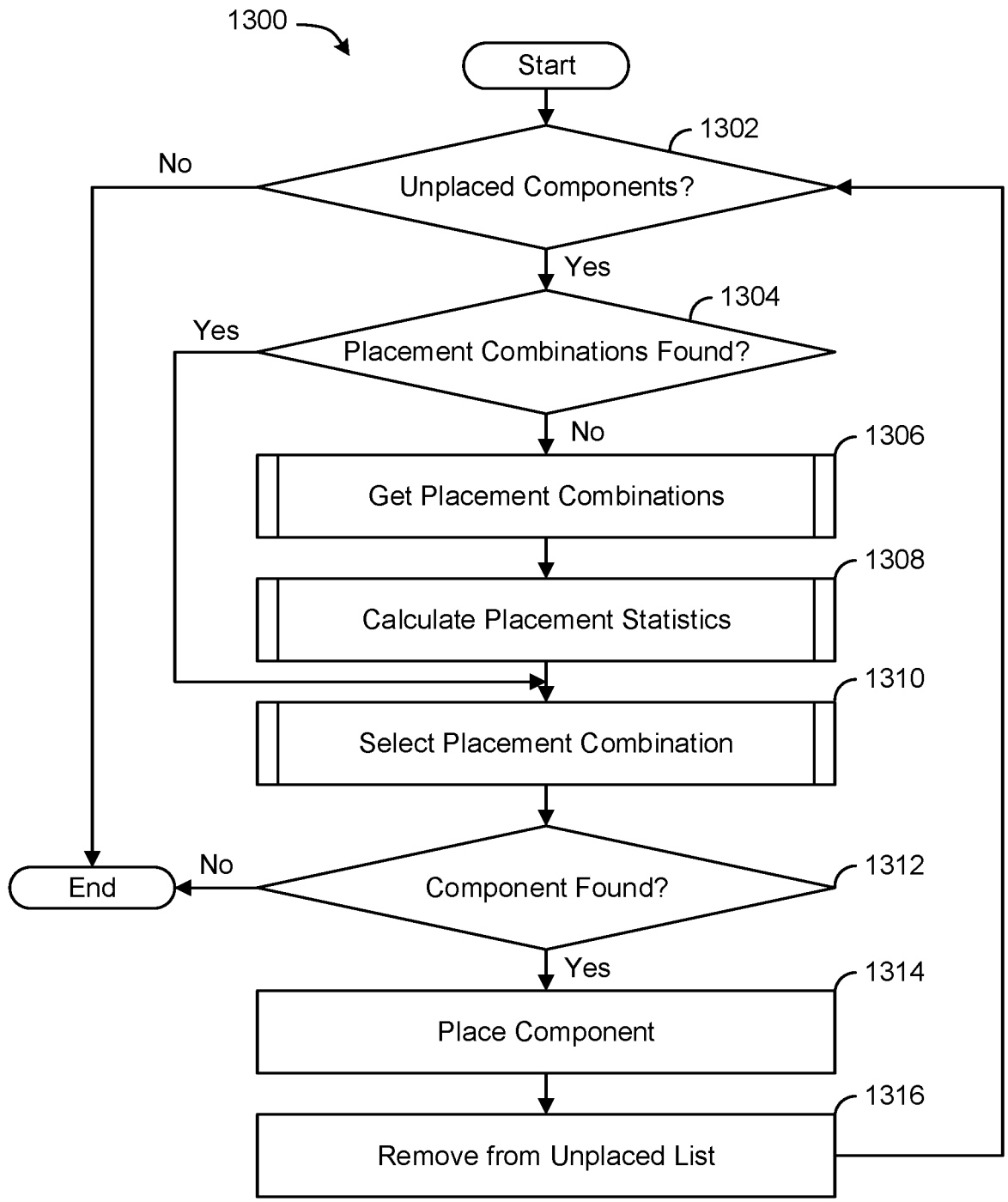
FIG. 13 is a flowchart of an example sub-process for placing a component in a layout for a fire alarm control panel, according to some embodiments

Turning now to FIG. 13, an exemplary flow chart of process 1300 for a component placement engine is shown, according to some embodiments. As described briefly above, the component placement engine illustrated by process 1300 is provided a series of test sets from the panel test selector described above with reference to FIG. 12. The component placement engine determines placement combinations for the unmapped components in the test set and may select the best placement combination based on the placement combination and test set statistics, as discussed above with reference to FIG. 11 at steps 1118 and 1120. Once a placement combination is selected the component placement engine may place the component and repeat the process until each component in the test set is placed. In some embodiments, process 1300 is implemented by configurator 100 as described above; however, it will be appreciated that all or part of process 1300 may be implemented by other systems (e.g., remote computing devices). It will also be appreciated that certain steps of process 1300 may be optional and, in some embodiments, process 1300 may be implemented using less than all of the steps.

At step 1302, process 1300 checks if there are unplaced modules in the test set. If no, process 1300 ends. For example, referring make to FIG. 10, the component placement engine accepts the one or more test set(s) with unplaced components from the panel test set selector in step 1008 and provides test sets with placed components to decision 1012. If at step 1302 there are unplaced components, then at step 1304 placement combinations are searched for. If placement combinations are existing, then the module is placed and process 1300 ends. If at step 1304 no placement combinations are found, then the get placement combinations function is initiated. The get placement combinations function is explained in further detail below with reference to FIG. 15, but in brief it creates a placement combination for each placement of each unmapped component in the each bay. At step 1308 the placement statistics are calculated for each placement combination. The process for calculating placement statistics is explained in further detail below with reference to FIG. 16. In brief, the statistics for each combination are based on the number of possible placement locations for a given component and the number of components affected by a given placement combination. At step 1310, a placement combination is selected. In some embodiments, the placement combination selected is based on the placement statistics. The process for selecting a placement combination is explained in further detail below with reference to FIG. 14. At step 1312, if a component is not found to fit the placement combination, process 1300 ends. If at step 1312 a component is found, the component is placed at step 1314 and the component is removed from the list of unplaced components for that test set at step 1316. Process 1300 then returns to step 1302 and the process is repeated for each unplaced component in the test set. When all available components are placed, process 1300 ends and referring back to FIG. 10 the placed test set is provided to step 1012.

Figure 14:
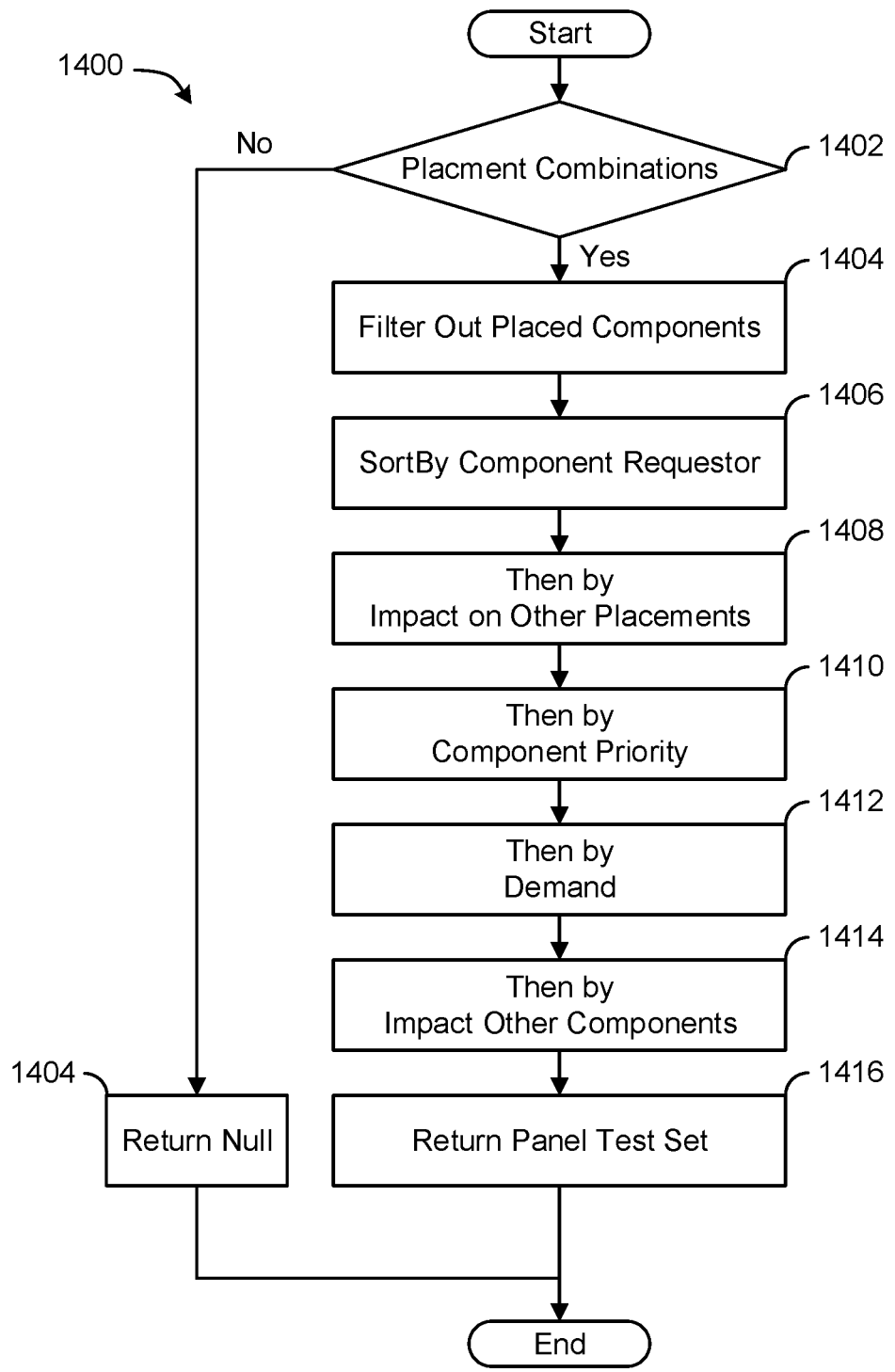
FIG. 14 is a flowchart of an example sub-process for selecting a component placement location for a fire alarm control panel, according to some embodiments

Turning now to FIG. 14, an exemplary flow chart of process 1400 for a select placement combination function is shown, according to some embodiments. As described briefly above, the select placement combination function receives the placement combinations generated at step 1306 of process 1300, and filters and sorts the placement combinations according to the configuration parameters (i.e., panel options, rules, operating requirements, etc.). Process 1400 then selects a test set according to the filter and sorting method dictated by the panel options and returns the test set to step 1312 of process 1300. In some embodiments, process 1400 is implemented by configurator 100 as described above; however, it will be appreciated that all or part of process 1400 may be implemented by other systems (e.g., remote computing devices). It will also be appreciated that certain steps of process 1400 may be optional and, in some embodiments, process 1400 may be implemented using less than all of the steps.

At step 1402, process 1400 checks to determine if multiple placement combinations are available for the components in the test set. If only one combination is available, than the select placement combination process 1400 returns a null value at step 1404 and ends. If at step 1402 multiple placement combinations are present, the process proceeds to step 1406 and filters out placed components that do not require placement combinations because they have already been placed. Steps 1408-1418 illustrate how the remaining test sets may be sorted, first by component requester, then by the impact on other placements, component priority, demand, and impact on other components. A first placement combination is then selected from the sorted list and returned at step 1418 to step 1310 of process 1300.

Figure 15:
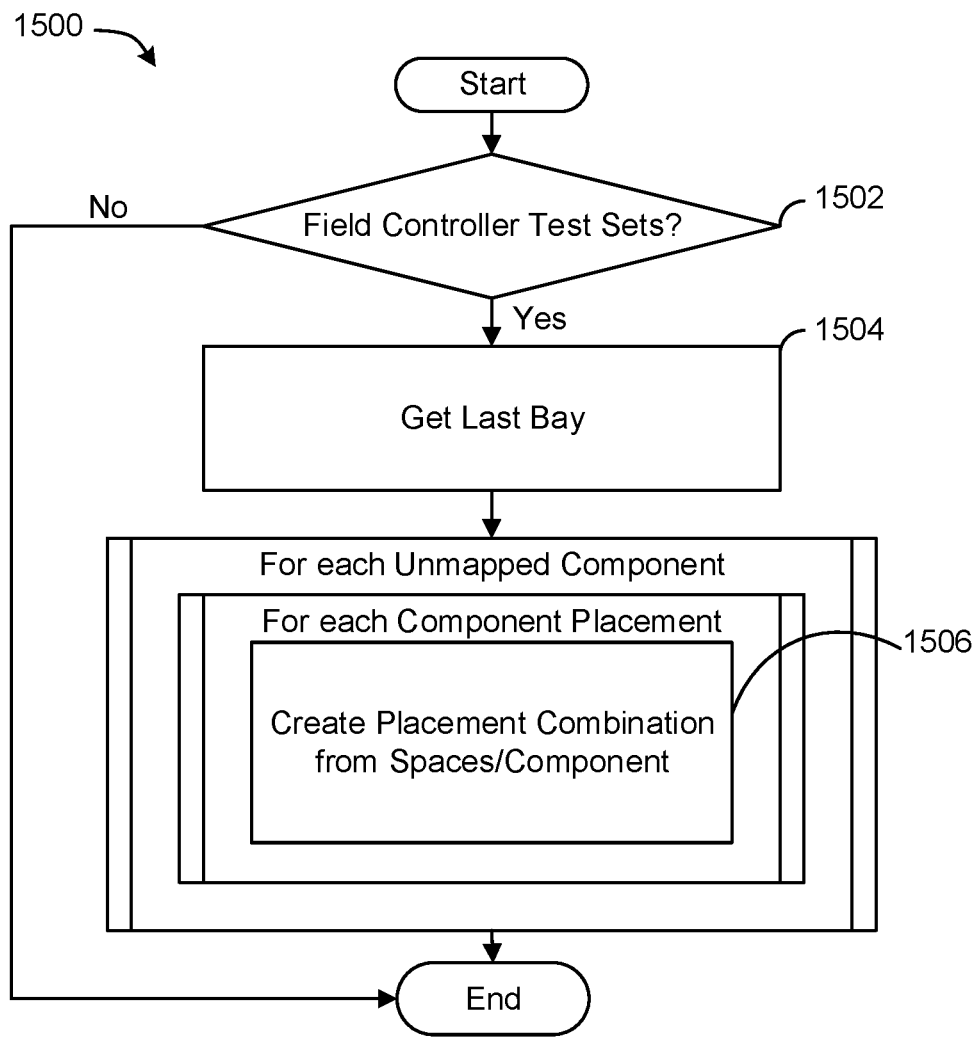
FIG. 15 is a flowchart of an example sub-process for creating a component placement combination for a fire alarm control panel, according to some embodiments

Turning now to FIG. 15, an exemplary flow chart of the process 1500 for the get placement combination function is shown, according to some embodiments. As described briefly above, the get placement combination process receives a test set with unmapped components and creates placement combinations for each unmapped component according to the provided rules, for example the rules in rules database 122. Get placement combinations then provides the combinations to step 1308 of process 1300. In some embodiments, process 1500 is implemented by configurator 100 as described above; however, it will be appreciated that all or part of process 1500 may be implemented by other systems (e.g., remote computing devices). It will also be appreciated that certain steps of process 400 may be optional and, in some embodiments, process 1500 may be implemented using less than all of the steps.

At step 1502 process 1500 checks if field controller test sets are present. If not, the process ends. If yes, then at step 1504 the last bay in the test set is obtained, and for each unmapped component and each component placement, at step 1506 placement combination(s) are created from the modules/components available. The placement combinations may be generated in the same or similar manner as the possible FACP layouts in step 406 of process 400. Step 1506 takes into account the system, cabinet, and bay demands derived from the user input and the rules of rules database 122. In some embodiments, tens of placement combinations may be created. In some embodiments, hundreds of placement combinations may be created. In some embodiments, thousands of placement combinations may be created. Once the combinations are generated, the placement combinations are provided to step 1308 of process 1300.

Figure 16:
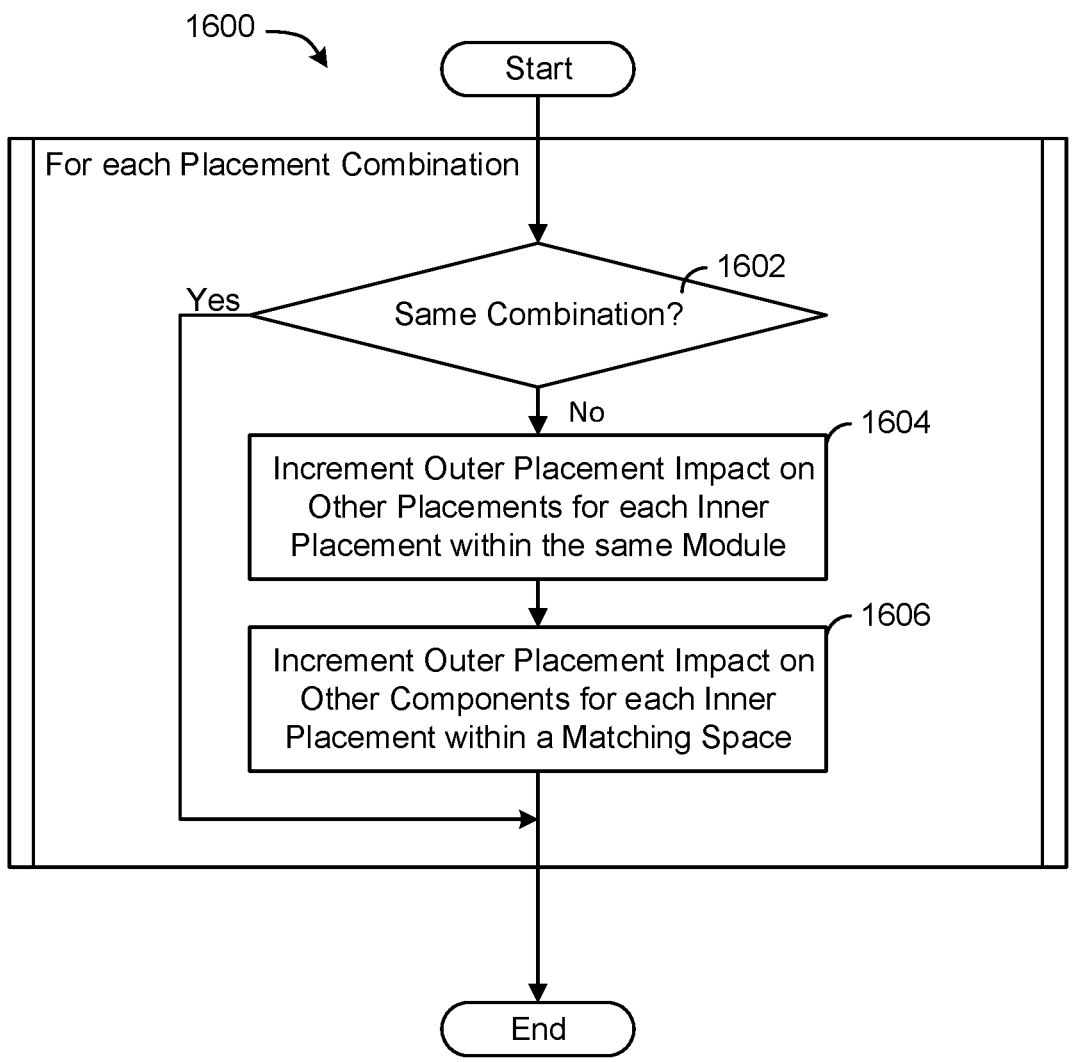
FIG. 16 is a flowchart of an example sub-process for calculating placement statistics for a fire alarm control panel, according to some embodiments

Turning now to FIG. 16, an exemplary flow chart of process 1600 for the calculate placement statistics function is shown, according to some embodiments. As described briefly above, the calculate placement statistics process determines for each placement combination a statistic based on the number of possible locations a component may be placed and the number of components impacted by a component being placed according to a given placement combination. In some embodiments, process 1600 may be the same or similar to step 408 for selecting certain FACP layouts. In some embodiments, process 1600 is implemented by configurator 100 as described above; however, it will be appreciated that all or part of process 1600 may be implemented by other systems (e.g., remote computing devices). It will also be appreciated that certain steps of process 1600 may be optional and, in some embodiments, process 1600 may be implemented using less than all of the steps.

At step 1602, process 1600 checks to determine if the placement combination is the same as another. In some embodiments, the check is against the previous test set, in some embodiments the check is against the next test set, and/or in some embodiments the entire provided list of test sets. At step 1604, process 1600 increments the outer placement impact on other placements for each inner placement within the same module. In some embodiments the impact on other placements is measure by the number of other placement options a component has. The fewer placement options, the more important it is to place the component early in the process, and that importance may be reflected in the placement statistic. While the priority of component placement is shown based on available placement options, the priority may additionally or alternatively be based on other criteria such as cost, user preference, rules in rule database 122, etc. At step 1606 process 1600 increments the outer placement impact on other components for each inner placement within a matching space. For example, referring back to FIG. 2, the display in bay 216 may take the place of what could be eight components as shown in bay 220. The number of components affected by a specific component placement may be the impact on other modules that is therefore used to calculate the placement statistics. Steps 1604 and 1606 are done for each placement combination. In some embodiments, the placement statistics are used in the select placement combination process shown in FIG. 14 to select a single optimal placement combination from the list of placement combinations generated by the get placement combinations process shown in FIG. 15.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements can be reversed or otherwise varied and the nature or number of discrete elements or positions can be altered or varied. Accordingly, all such modifications are intended to be included within the scope of the present disclosure. The order or sequence of any process or method steps can be varied or re-sequenced according to alternative embodiments. Other substitutions, modifications, changes, and omissions can be made in the design, operating conditions and arrangement of the exemplary embodiments without departing from the scope of the present disclosure.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and are considered to be within the scope of the disclosure.

The present disclosure contemplates methods, systems and program products on any machine-readable media for accomplishing various operations. The embodiments of the present disclosure can be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

What is claimed is:

1. A system for configuring a fire alarm control panel (FACP), the system comprising:
one or more memory devices having instructions stored thereon that, when executed by one or more processors, cause the one or more processors to perform operations comprising:
receiving a first user input identifying a configuration requirement of the FACP;
obtaining configuration data for a plurality of FACP components capable of being included in the FACP and a plurality of FACP enclosure components, the configuration data indicating at least one of a size, a power consumption, or a cost for at least one component of the plurality of FACP components;
using the configuration data to generate a plurality of test sets that satisfy the configuration requirement according to one or more configuration rules, each of the plurality of test sets defining a subset of the plurality of FACP components and a subset of the plurality of FACP enclosure components and indicating a unique layout of the FACP, wherein the unique layout comprises an arrangement of a FACP enclosure comprising the subset of the plurality of FACP enclosure components and positions for each of the subset of the plurality of FACP components on at least one of a plurality of layered planes within the FACP enclosure;
identifying a test set of the plurality of test sets based on configuration scores associated with each of the plurality of test sets; and
presenting, via a graphical user interface, a visual representation of the unique layout of the FACP associated with the identified test set.

2. The system of claim 1, the operations further comprising receiving a second user input defining at least one of a standby or an alarm time power requirement, wherein the plurality of test sets are further generated based on the second user input.

3. The system of claim 1, the operations further comprising determining at least one of a number or a capacity of batteries to include in the FACP based on the unique layout associated with the identified test set.

4. The system of claim 1, wherein the visual representation includes a 3-dimensional (3D) model of the FACP populated with the plurality of layered planes and the at least one component.

5. The system of claim 1, wherein the one or more configuration rules define at least one of component placement within the FACP or power requirements for the FACP.

6. The system of claim 1, the configuration scores comprise estimated costs associated with each of the plurality of test sets.

7. The system of claim 1, the operations further comprising generating a bill of materials based on the unique layout of the FACP associated with the identified test set.

8. The system of claim 1, wherein the unique layout is for a cabinet with a door, and wherein the plurality of layered planes within the FACP comprise at least one of a behind-the-door plane and a front-of-door plane.

9. A method for determining a layout of a fire alarm control panel (FACP), the method comprising:
receiving a first user input identifying a configuration requirement for the FACP;
obtaining configuration data for a plurality of FACP components capable of being included in the FACP and a plurality of FACP enclosure components, the configuration data indicating at least one of a size, a power consumption, or a cost for at least one component of the plurality of FACP components;
using the configuration data to generate a plurality of test sets that satisfy the configuration requirement according to one or more configuration rules, each of the plurality of test sets defining a subset of the plurality of FACP components and a subset of the plurality of FACP enclosure components and indicating a unique layout of the FACP, wherein the unique layout comprises an arrangement of a FACP enclosure comprising the subset of the plurality of FACP enclosure components and positions for each of the subset of the plurality of FACP components on at least one of a plurality of layered planes within the FACP enclosure;
identifying a test set of the plurality of test sets based on configuration scores associated with each of the plurality of test sets; and
presenting, via a graphical user interface, a visual representation of the unique layout of the FACP associated with the identified test set.

10. The method of claim 9, further comprising receiving a second user input defining at least one of a standby or an alarm time power requirement, wherein the plurality of test sets are further generated based on the second user input.

11. The method of claim 9, further comprising determining at least one of a number or a capacity of batteries to include in the FACP based on the unique layout associated with the identified test set.

12. The method of claim 9, wherein the visual representation includes a 3-dimensional (3D) model of the FACP populated with the plurality of layered planes and the at least one component.

13. The method of claim 9, wherein the one or more configuration rules define at least one of component placement within the FACP or power requirements for the FACP.

14. The method of claim 9, the configuration scores comprise estimated costs associated with each of the plurality of test sets.

15. The method of claim 9, further comprising generating a bill of materials based on the unique layout of the FACP associated with the identified test set.

16. The method of claim 9, wherein the unique layout is for a cabinet with a door, and wherein the plurality of layered planes within the FACP comprise at least one of a behind-the-door plane and a front-of-door plane.

17. A non-transitory computer readable medium comprising instructions stored thereon that, when executed by one or more processors, cause the one or more processors to:
receive a first user input identifying a configuration requirement of a fire alarm control panel (FACP);
obtain configuration data for a plurality of FACP components capable of being included in the FACP and a plurality of FACP enclosure components, the configuration data indicating at least one of a size, a power consumption, or a cost for at least one component of the plurality of FACP components;
use the configuration data to generate a plurality of test sets that satisfy the configuration requirement according to one or more configuration rules, each of the plurality of test sets defining a subset of the plurality of FACP components and a subset of the plurality of FACP enclosure components and indicating a unique layout of the FACP, wherein the unique layout comprises an arrangement of a FACP enclosure comprising the subset of the plurality of FACP enclosure components and positions for each of the subset of the plurality of FACP components on at least one of a plurality of layered planes within the FACP enclosure;
identify a test set of the plurality of test sets based on configuration scores associated with each of the plurality of test sets; and
present, via a graphical user interface, a visual representation of the unique layout of the FACP associated with the identified test set.

18. The computer readable medium of claim 17, the instructions further causing the one or more processors to receive a second user input defining at least one of a standby or an alarm time power requirement, wherein the plurality of test sets are further generated based on the second user input.

19. The computer readable medium of claim 17, the instructions further causing the one or more processors to determine at least one of a number or a capacity of batteries to include in the FACP based on the unique layout associated with the identified test set.

20. The computer readable medium of claim 17, wherein the one or more configuration rules define at least one of component placement within the FACP or power requirements for the FACP.

* * * * *